United States Patent
Poulton

(10) Patent No.: US 7,492,302 B2
(45) Date of Patent: Feb. 17, 2009

(54) ANALOG-TO-DIGITAL CONVERTER WITH REDUCED METASTABLE ERRORS

(75) Inventor: Kenneth D. Poulton, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/742,489

(22) Filed: Apr. 30, 2007

(65) Prior Publication Data

US 2008/0266163 A1 Oct. 30, 2008

(51) Int. Cl.
*H03M 1/12* (2006.01)
(52) U.S. Cl. ........................ 341/156; 341/155
(58) Field of Classification Search ................ 341/161, 341/118, 155, 162, 163, 156, 172
See application file for complete search history.

(56) References Cited

U.S. PATENT DOCUMENTS 5,327,131 A * 7/1994 Ueno et al. ................. 341/136
6,501,412 B2 * 12/2002 Tanabe ....................... 341/161
6,867,723 B1 * 3/2005 Tachibana et al. ........... 341/155

* cited by examiner

*Primary Examiner*—Brian Young
(74) *Attorney, Agent, or Firm*—Ian Hardcastle

(57) ABSTRACT

In an analog-to-digital converter, an analog-to-digital conversion stage comprising a comparator and an analog residual signal generator. The comparator is operable to compare an analog input signal or a sample of the analog input signal with a threshold to generate a bit signal. The analog residual signal generator is operable to generate an analog residual signal from signals comprising the sample of the analog input signal and the bit signal such that, at a level of the analog input signal equal to the threshold of the comparator, the analog residual signal has a level independent of the state of the bit signal. The analog residual signal generator comprises a summing element, a selective inverter and an amplifier in series. The summing element is operable to sum a signal input to it with a reference signal. The selective inverter precedes the summing element, and is operable in response to a first state of the bit signal to pass a signal input to it, and is operable in response to a second state of the bit signal to invert the signal input to it.

26 Claims, 11 Drawing Sheets

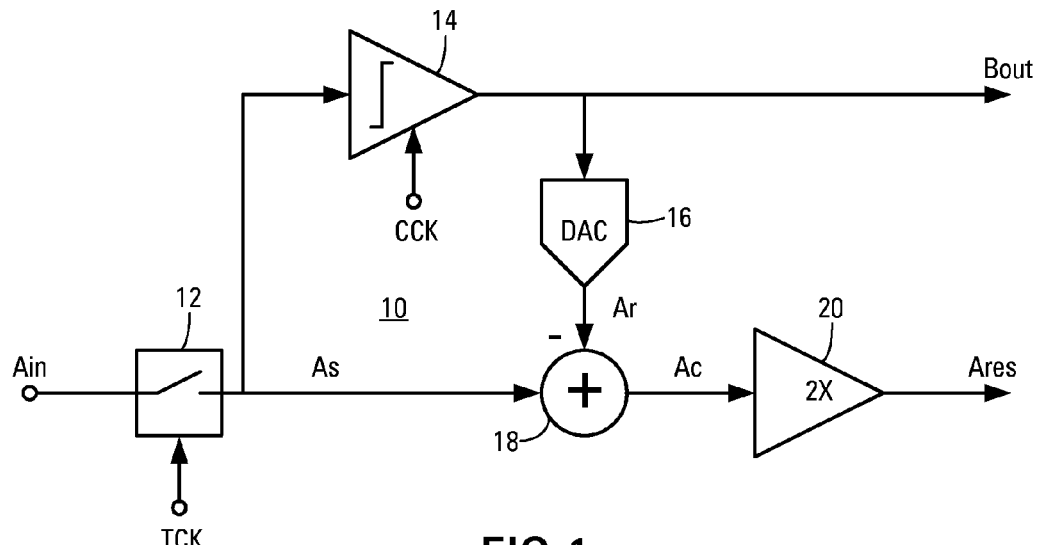
FIG.1
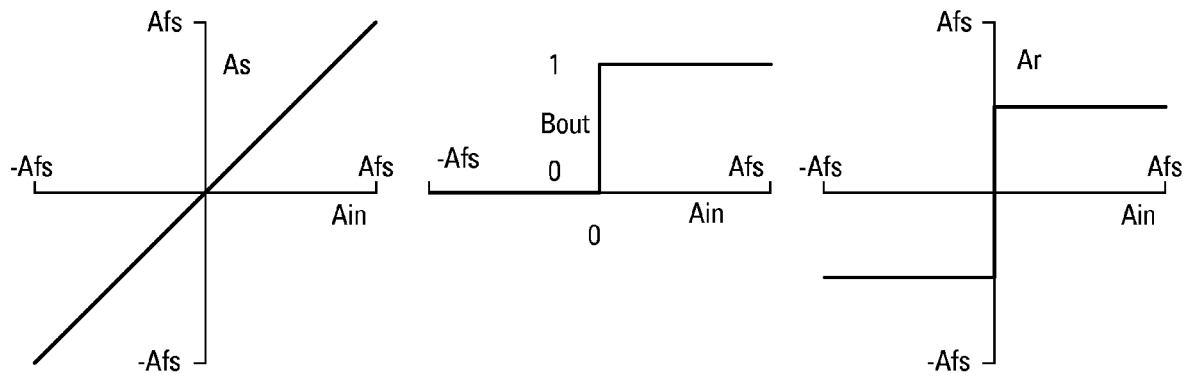
FIG.2A  FIG.2B  FIG.2C
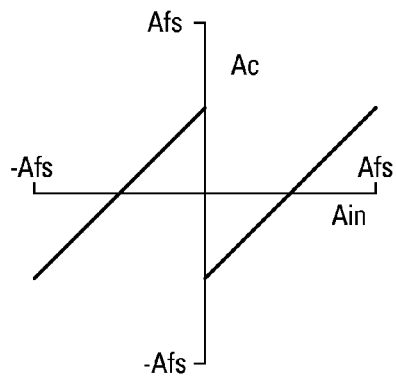 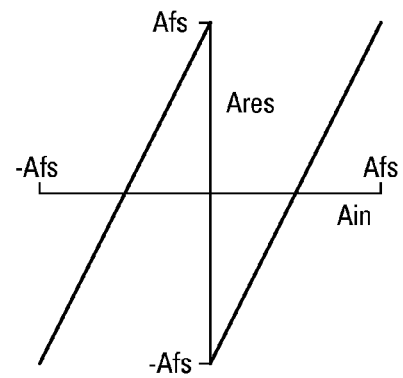
FIG.2D  FIG.2E

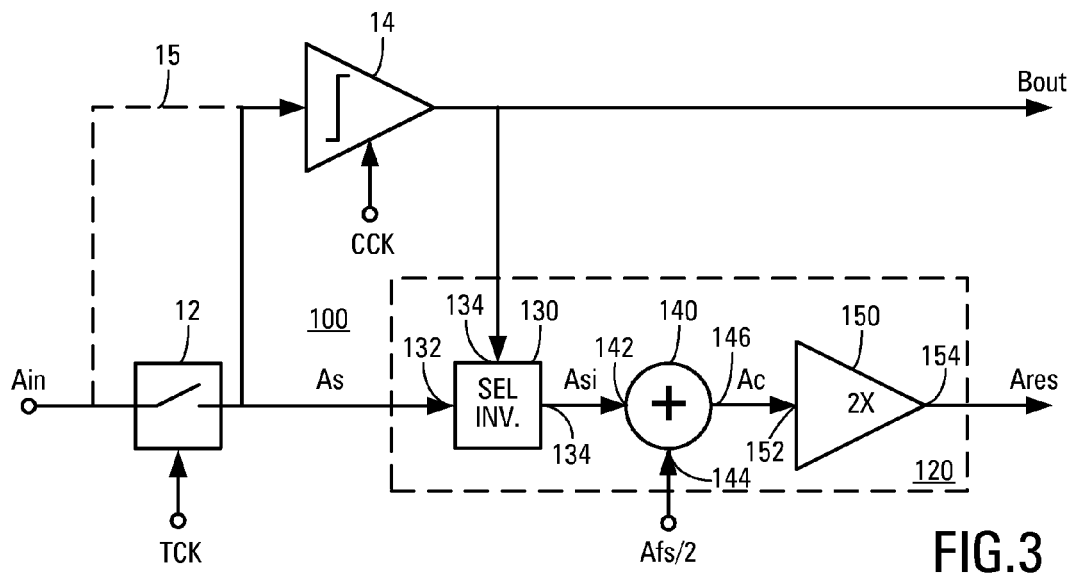
FIG.3
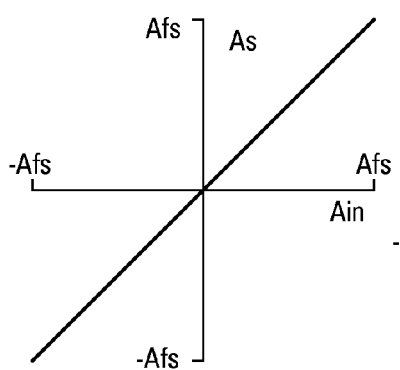
FIG.4A
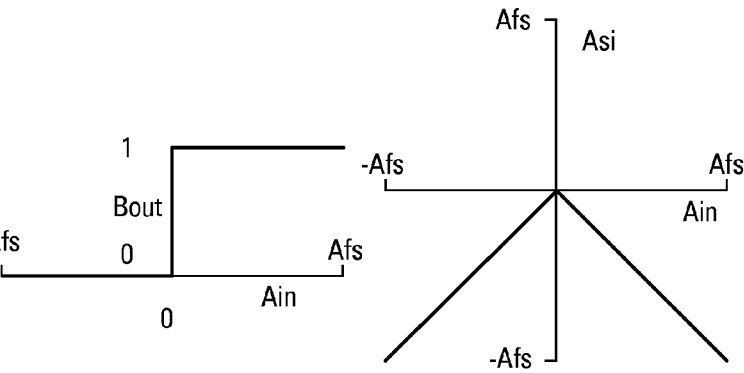
FIG.4B
FIG.4C
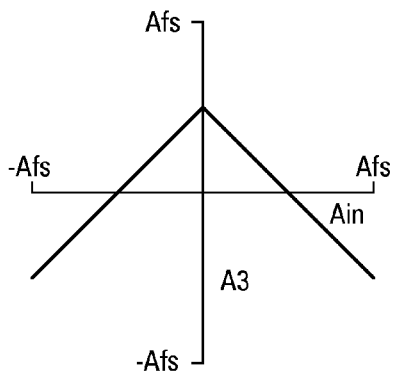
FIG.4D
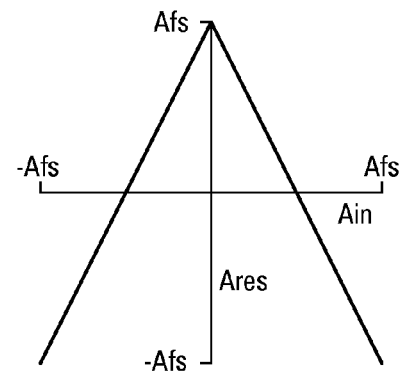
FIG.4E

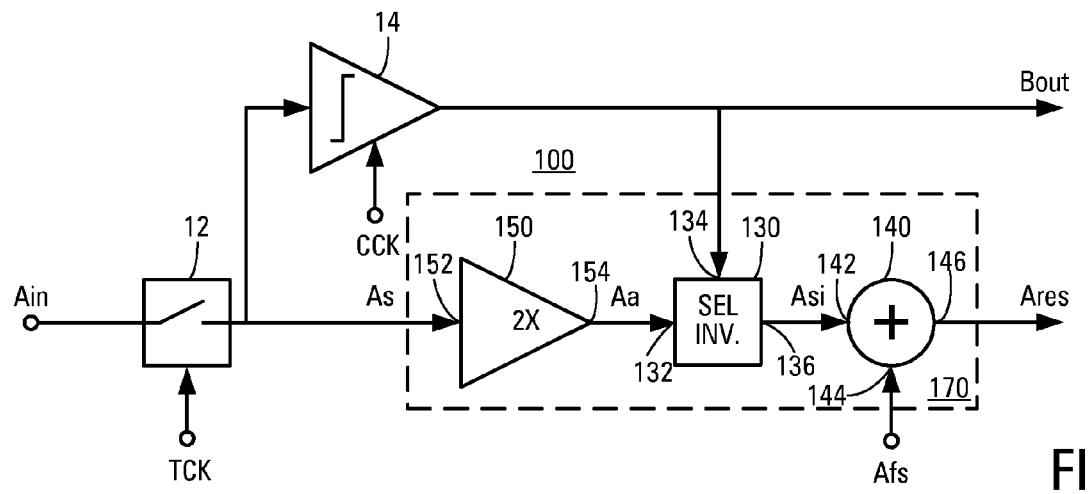
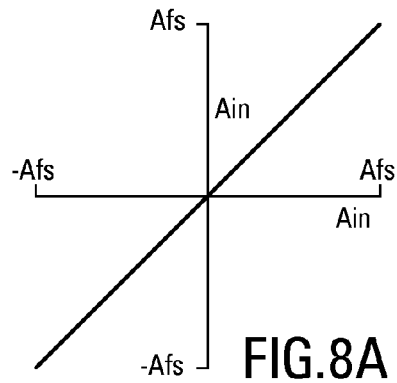
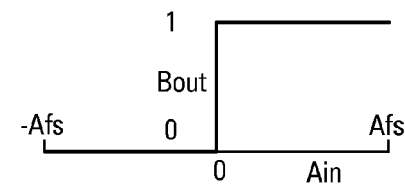
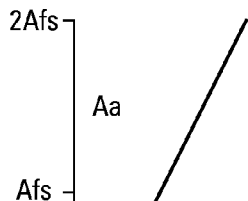
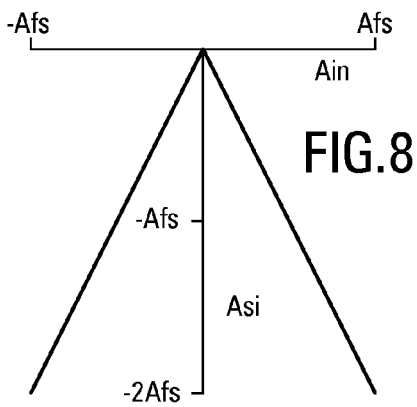
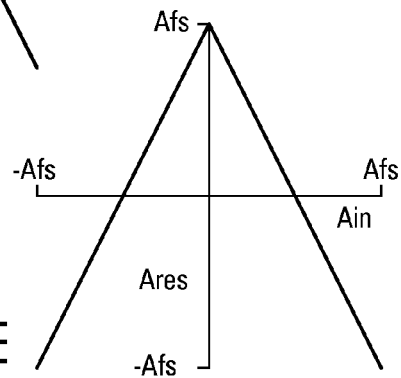

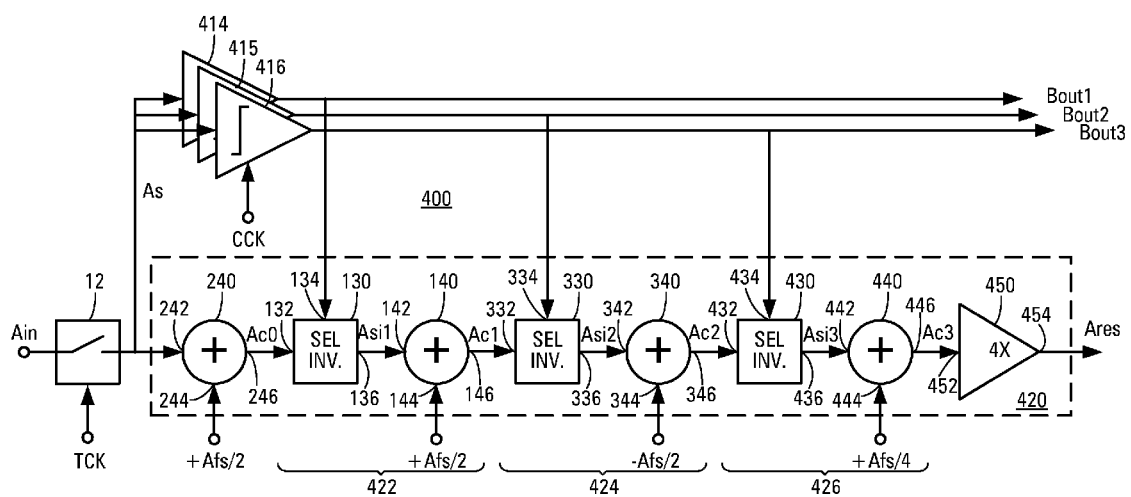
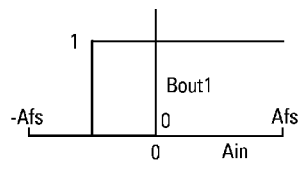
FIG.14A
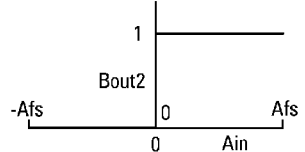
FIG.14B
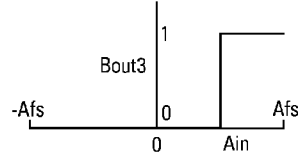
FIG.14C
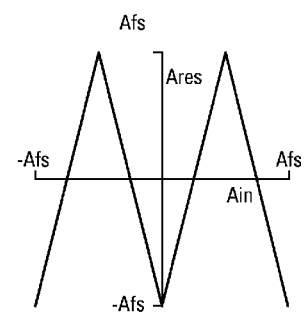
FIG.14D

ANALOG-TO-DIGITAL CONVERTER WITH REDUCED METASTABLE ERRORS

BACKGROUND

Multi-stage analog-to-digital converters (ADCs) are composed of M conversion stages effectively connected in series, where M is an integer. Such analog-to-digital converters convert samples of an analog input signal to respective N-bit digital values that collectively constitute a digital output signal. Each conversion stage receives an analog signal. The conversion stage comprises a sample-and-hold circuit or a track-and-hold circuit that samples the analog signal to generate an analog signal sample. The conversion stage additionally comprises one or more comparators each of which compares the analog signal sample with a respective threshold to generate a respective bit signal that provides a respective bit of the digital output signal. The conversion stage additionally derives an analog residual signal from the analog signal sample and the bit signal. The first conversion stage receives the analog input signal as its analog signal and generates the most-significant bit or bits of the digital output signal. Each remaining conversion stage receives the analog residual signal generated by the previous conversion stage as its analog signal and generates one or more of the less-significant bits of the digital output signal.

In this disclosure, the term multi-stage analog-to-digital converter will be regarded as encompassing an analog-to-digital converter having M physical conversion stages in series, as described above. The term will additionally be regarded as encompassing an M-stage cyclic analog-to-digital converter having a single conversion stage. Such a cyclic analog-to-digital converter converts the analog input signal to the digital output signal in M consecutive conversion periods. The analog residual signal generated by the conversion stage in one conversion period provides the analog input signal of the conversion stage in the next conversion period.

Multi-stage analog-to-digital converters are subject to metastable states. These occur whenever the level of the analog signal is so close to a threshold of the comparator of one of the conversion stages that the comparator takes a long time to determine the state of the bit signal, i.e., whether to generate the bit signal as a logical 1 or a logical 0. If the metastable state propagates into two or more succeeding circuits, including both the digital signal path to which the bit signal is input and the conversion stages, the metastable state may be resolved as a logical 1 in one circuit, and as a logical 0 in another. Alternatively, the metastable state may be treated as an intermediate value in a succeeding stage. This inconsistency in interpreting the level represented by the analog input signal is what causes metastable states to become metastable errors in the digital output signal generated by the analog-to-digital converter. Metastable errors in the digital output signal are also known as sparkle codes.

The frequency at which metastable errors are tolerable is strongly application dependent. Some communication applications are said to tolerate half-scale metastable error rates as high as $10^{-4}$. Instrumentation applications such as oscilloscopes may operate for long times with peak detection operations occurring on the output data. In this case, metastable errors larger than the thermal noise level must seldom occur in the time over which such measurements can be made. This might lead to a maximum allowable metastable error rate of less than $10^{-17}$.

ADCs known as flash ADCs turn metastable states into metastable errors when such ADCs propagate a single metastable comparator value into two different paths in the logic that encodes $2^N-1$ comparator results into an N-bit binary value. Therefore, the metastable error rate of a flash ADC can be reduced by adding pipelining flipflops between each comparator and the binary encoder. For every flipflop with regeneration time constant Tr and with a clock period Ts added, the probability of a metastable error is reduced by exp (Ts/Tr).

In a refinement, the $2^{N-1}$ comparator outputs are encoded into N-bit Gray code before the pipelining flipflops. The key characteristic of Gray (and Gray-like) codes is that at each increment of the code value, only one bit changes. This means that if any one comparator is metastable, exactly one Gray-encoded bit will be metastable. The Gray encoder is followed by pipelining flipflops, which resolve the metastable state, and a Gray-to-binary transcoder to generates the binary output.

ADCs known as Folding and Interpolating ADCs can inherently produce a Gray-coded or Gray-like coded digital output signal. Therefore, such ADCs can also take advantage of the above-described technique to reduce metastable errors without the need to provide an additional Gray encoder.

In A 90 nm CMOS 1.2V 6b 1 GS/s Two-step Subranging ADC, ISSCC 2006, PAPER 31.2A, Figuerido et al. describe how an ADC known as a sub-ranging ADC can be made more tolerant of metastable states. In this, two banks of fine comparators are used in a way that prevents a delayed change in a first-stage comparator due to a metastable state from changing the references actually needed for the second stage. However, this technique imposes a cost of 1.5 bits of redundancy, i.e., this technique employs approximately three times as many comparators than a more conventional ADC.

In A 6b 600 MS/s 5.3 mW Asynchronous ADC in 0.13 μm CMOS, ISSCC 2006, PAPER 31.5, Chen et al. (Chen) disclose a successive-approximation ADC that is resistant to metastable states, specifically to metastable states that cause the asynchronous timing circuit take too long to settle. Chen's circuit still requires that a metastable comparator decision be resolved before the circuit can proceed to the next step of the successive approximation.

In general, multi-stage ADCs are more susceptible to metastable errors because, in each stage, such ADCs generate one or more bit signals together with an analog residual signal that provides the analog input signal of the next stage. Any metastable comparator value will eventually resolve itself in the following digital logic, but only a limited time is available for the analog residual signal to be formed before it is sampled by the next stage. Once the analog residual signal has been sampled, a conversion error will occur if the comparator does not eventually resolve to the same state as the one used to form the analog residual signal. This requirement can limit the conversion rate of the ADC.

FIG. 1 is a block diagram showing an example of a conventional one-bit-per-stage analog-to-digital conversion stage 10 suitable for use as one conversion stage of a multi-stage analog-to-digital converter. Conversion stage 10 constitutes part of an analog-to-digital converter (not shown) capable of converting samples of an analog input signal Ain to a digital output signal. Analog input signal Ain is a voltage or a current: the letter A is used generically to denote either. Analog input signal Ain has a level within the input range of the analog-to-digital converter. The input range extends from a negative full-scale level −Afs to a positive full-scale level +Afs.

Conversion stage 10 is composed of a track-and-hold circuit 12, a comparator 14, a digital-to-analog converter 16, a summing element 18 and an amplifier 20.

Track-and-hold circuit 12 has a signal input, a clock input and an output. The signal input of track-and-hold circuit 12 is connected to receive an analog input signal Ain. When conversion stage 10 provides the most-significant bit of the digital signal generated by the analog-to-digital converter of which the conversion stage constitutes part, analog input signal Ain is the analog input signal of the analog-to-digital converter. Otherwise, analog input signal Ain is the analog residual signal generated by the previous conversion stage, i.e., the conversion stage that provides the next-more significant bit of the digital output signal. Alternatively, in a cyclic analog-to-digital converter, analog input signal Ain is the analog residual signal generated by conversion stage 10 in the previous conversion cycle. Track-and-hold circuit 12 tracks analog input signal Ain until a track clock signal TCK received at its clock input changes state. This state of track clock signal TCK sets track-and-hold circuit 12 it its hold mode in which it holds analog input signal Ain until track clock signal TCK reverts to its original state. In its hold mode, track-and-hold circuit 12 provides an analog signal sample As to comparator 14 and summing element 18. The level of analog signal sample As is equal to the instantaneous level of analog input signal Ain at the time at which track clock signal TCK changed track-and-hold circuit to its hold mode.

Comparator 14 has a signal input, a clock input and a bit signal output. The signal input of comparator 14 is connected to the output of track-and-hold circuit 12. The bit signal output of comparator 14 provides the bit signal output of conversion stage 10 at which the conversion stage outputs a respective bit signal Bout. The clock input of comparator 14 is connected to receive a comparator clock signal CCK, which changes state after track clock signal TCK. In response to comparator clock signal CCK, comparator 14 compares analog signal sample As received at its signal input with a threshold. The threshold of comparator 14 is also a voltage or a current, depending on whether analog input signal is a voltage or a current, respectively.

Digital-to-analog converter 16 is a one-bit digital-to-analog converter having a digital input and an analog output. The digital input is connected to receive bit signal Bout from the output of comparator 14. Digital-to-analog converter 16 converts the bit signal Bout received at its digital input to a recovered analog signal Ar. Recovered analog signal Ar is equal to negative one-half of full-scale (−Afs/2) when bit signal Bout is in a first state, e.g., logical zero, and is equal to positive one-half of full scale (−Afs/2) when bit signal Bout is in a second state, e.g., logical one.

Summing element 18 is a two-input summing element having a non-inverting input, an inverting input and an output. The non-inverting input is connected to receive analog signal sample As from the output of track-and-hold circuit 12. The inverting input is connected to receive recovered analog signal Ar from the analog output of digital-to-analog converter 16. Summing element 18 sums analog signal sample As and recovered analog signal Ar to generate an analog combined signal Ac.

Amplifier 20 has an input and an output and, in this example, has a gain nominally equal to two. The input of amplifier 20 is connected to receive analog combined signal Ac from the output of summing element 18. Amplifier 20 amplifies analog combined signal Ac with a gain of two and outputs the analog residual signal Afs of conversion stage 10 at its output.

Operation of conventional conversion stage 10 to convert an analog input signal Ain to bit signal Bout and to provide analog residual signal Ares for input to a following conversion stage (not shown) will now be described with reference to the graphs shown in FIGS. 2A–2E. In the example shown, analog input signal Ain ranges in level from −Afs to +Afs, where Afs indicates full scale of the input range of the analog-to-digital converter.

FIG. 2A is a graph showing the relationship between the level of analog signal sample As at the output of track-and-hold circuit 12 at the time that track clock signal TCK changes state and the level of analog input signal Ain.

FIG. 2B is a graph showing the relationship between the state of bit signal Bout at the output of comparator 14 and the level of analog input signal Ain. In the example shown, the threshold of comparator 14 is zero. Comparator 14 outputs bit signal Bout in a first state, e.g., logical zero, when the level of analog signal sample As is less than its threshold and outputs bit signal Bout in a second state, e.g., logical one, when the level of analog signal sample As is greater than its threshold. As noted above, when the level of analog input signal Ain and, hence, analog signal sample As, differs only slightly from the threshold of comparator 14, comparator 14 may take a substantial time to determine the state of bit signal Bout.

FIG. 2C is a graph showing the relationship between the level of recovered analog signal Ar at the output of digital-to-analog converter 16 and that of analog input signal Ain. For levels of analog input signal Ain less than the threshold of comparator 14, i.e., less than zero in this example, bit signal Bout is in its logical zero state, and the level of recovered analog signal Ar is therefore −Afs/2. On the other hand, for levels of analog input signal Ain greater than the threshold of comparator 14, bit signal Bout is in its logical one state, and the level of recovered analog signal Ar is therefore +Afs/2.

FIG. 2D is a graph showing the relationship between the level of analog combined signal Ac output by summing element 18 and that of analog input signal Ain. For levels of analog input signal Ain less than the threshold of comparator 14, i.e., less than zero in this example, the level of analog combined signal Ac is shifted relative to that of analog input signal Ain by (−(−Afs/2)=+Afs/2) as a result of a recovered analog signal level of −Afs/2 being subtracted from analog signal sample As. For levels of analog input signal Ain greater than the threshold, the level of analog combined signal Ac is shifted relative to that of analog input signal Ain by (−(+Afs/2)=−Afs/2 as a result of a recovered analog signal level of +Afs/2 being subtracted from analog signal sample As. At a level of analog input signal Ain equal to the threshold of comparator 14, the transfer function between analog input signal Ain and combined analog signal Ac exhibits a discontinuity with a substantially infinite slope between levels of −Afs/2 and +Afs/2.

FIG. 2E is a graph showing the relationship between the level of analog residual signal Ares output by amplifier 20 and that of analog input signal Ain. FIG. 2E represents the overall transfer function of conventional conversion stage 10 with respect to analog residual signal Ares. As the level of analog input signal Ain increases from negative full-scale to the threshold of comparator 14, i.e., zero in this example, the level of analog residual signal Ares increases proportionally with a slope of +2 from −Afs to +Afs. Moreover, as the level of analog input signal Ain increases from the threshold of comparator 14 to positive full-scale, the level of analog residual signal Ares again increases proportionally with a slope of +2 from −Afs to +Afs. At a level of analog input signal Ain equal to the threshold of comparator 14, the transfer function between analog input signal Ain and analog residual signal Ares exhibits a discontinuity between levels of −Afs and +Afs with a slope typically limited by the slew rate of amplifier 20.

When the output of comparator 14 is in a metastable state, the level of recovered analog signal Ar output by digital-toanalog converter 16 may be equal to +Afs/2 or to −Afs/2. Alternatively, the level of recovered analog signal Ar may be at an indeterminate level between +Afs/2 and −Afs/2. The output of comparator 14 does not consistently correspond to the final state of bit signal Bout because the state of bit signal Bout is not yet decided. Consequently, when analog residual signal Ares is sampled by the track-and-hold circuit of the following conversion stage (not shown), the metastable state of bit signal Bout must be resolved before the track clock signal of the following conversion stage changes to its hold state. If the metastable state is not resolved, bit signal Bout may resolve to a state inconsistent with analog residual signal Ares that provides the analog input signal Ain of the following conversion stage. In this event, a conversion error will occur.

Accordingly, what is needed is an effective way to prevent conversion errors resulting from metastable states of the comparator of a conversion stage of a multi-stage analog-to-digital converter.

BRIEF DESCRIPTION OF THE DRAWINGS

FIG. 1 is a block diagram showing an example of a conventional one-bit-per-stage analog-to-digital conversion stage suitable for use as one conversion stage of a multi-stage analog-to-digital converter.

FIGS. 2A-2E are graphs illustrating the operation of the conventional analog-to-digital conversion stage shown in FIG. 1.

FIG. 3 is a block diagram showing an example of a one-bit-per-stage analog-to-digital conversion stage in accordance with an embodiment of the invention.

FIGS. 4A-4E are graphs illustrating the operation of the analog-to-digital conversion stage shown in FIG. 3.

FIG. 7 is a block diagram showing another example of a one-bit-per-stage analog-to-digital conversion stage in accordance with an embodiment of the invention.

FIGS. 8A-8E are graphs illustrating the operation of the analog-to-digital conversion stage shown in FIG. 3.

FIG. 13 is a block diagram showing an example of a four-levels-per-stage analog-to-digital conversion stage in accordance with an embodiment of the invention.

FIGS. 14A-14D are graphs illustrating the operation of the analog-to-digital conversion stage shown in FIG. 13.

DETAILED DESCRIPTION

Figure 5:
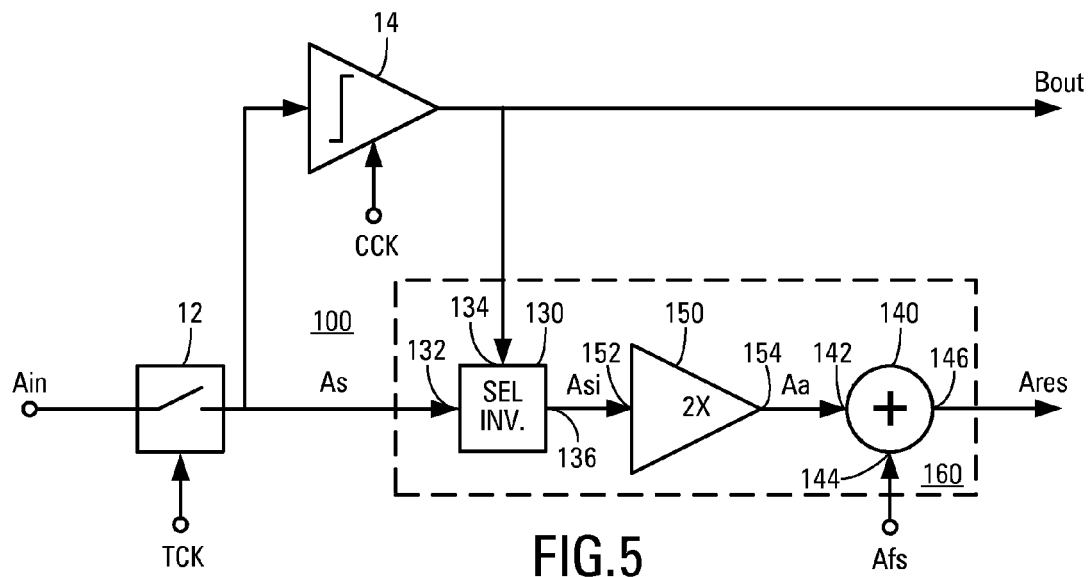
FIG. 5 is a block diagram showing another example of a one-bit-per-stage analog-to-digital conversion stage in accordance with an embodiment of the invention.

In embodiments of the invention, conversion errors due to metastable states in the comparator(s) of the conversion stage of an analog-to-digital converter are prevented by using a conversion stage having a transfer function between the analog input signal and the analog residual signal in which, at a level of the analog input signal equal to the threshold of the comparator, the level of the analog residual signal is substantially the same in both states of the bit signal. With such a conversion stage, a metastable state of the bit signal or a late resolution of the bit signal does not materially change the analog residual signal. This makes an otherwise ideal analog-to-digital converter incorporating such conversion stages completely insensitive to metastable states. More precisely, it reduces the size of the conversion error due to metastable states to that of the offset and gain errors of the comparator(s) and the analog residual signal generator.

In an analog-to-digital converter, an analog-to-digital conversion stage comprising a comparator and an analog residual signal generator. The comparator is operable to compare an analog input signal or a sample of the analog input signal with a threshold to generate a bit signal. The analog residual signal generator is operable to generate an analog residual signal from signals comprising the sample of the analog input signal and the bit signal such that, at a level of the analog input signal equal to the threshold of the comparator, the analog residual signal has a level independent of the state of the bit signal. The analog residual signal generator comprises a summing element, a selective inverter and an amplifier in series. The summing element is operable to sum a signal input to it with a reference signal. The selective inverter precedes the summing element, and is operable in response to a first state of the bit signal to pass a signal input to it, and is operable in response to a second state of the bit signal to invert the signal input to it.

FIG. 3 is a block diagram showing an example of an analog-to-digital conversion stage 100 in accordance with an embodiment of the invention. Conversion stage 100 constitutes one conversion stage of a multi-stage analog-to-digital converter (not shown) capable of converting an analog input signal Ain to a digital output signal. Conversion stage 100 is composed of track-and-hold circuit 12, comparator 14 and an analog residual signal generator 120. Analog residual signal generator 120 is connected to receive an analog signal sample As from track-and-hold circuit 12 and additionally to receive a bit signal Bout from comparator 14. Analog residual signal generator 120 is operable to generate an analog residual signal Ares from analog signal sample As and bit signal Bout such that, at a level of analog input signal Ain equal to the threshold of comparator 14, analog residual signal Ares has a level independent of the state of bit signal Bout.

Analog residual signal generator 120 is composed of a selective inverter 130, a summing element 140 and an amplifier 150 connected in series with selective inverter 130 preceding summing element 140. In the example shown, selective inverter 130, summing element 140 and amplifier 150 are connected in series in the stated order.

Track-and-hold circuit 12 and comparator 14 are described above with reference to FIG. 1 and will not be described again in detail. The signal input of track-and-hold circuit 12 is connected to receive an analog input signal Ain that is a voltage or a current. When conversion stage 100 provides the most-significant bit of the digital output signal generated by the analog-to-digital converter (not shown) of which conversion stage 100 constitutes part, analog input signal Ain is the analog input signal of the analog-to-digital converter. Otherwise, analog input signal Ain is the analog residual signal generated by the previous conversion stage, i.e., the conversion stage that provides the next-more significant bit of the digital output signal.

Comparator 14 operates in response to comparator clock signal CCK to compare an analog signal sample As output by track-and-hold circuit 12 with a threshold. Comparator 14 generates bit signal Bout in a first state, e.g., logical zero, when the level of analog signal sample As is less than the threshold. Comparator 14 generates bit signal Bout in a second state, e.g., logical one, when the level of analog signal sample As is greater than the threshold. The threshold of comparator 14 is a voltage or a current, depending on whether analog input signal Ain is a voltage or a current, respectively. As noted above, when the level of analog input signal Ain and, hence, analog signal sample As, differs only slightly from the threshold of comparator 14, comparator 14 may take a substantial time to determine the state of bit signal Bout.

In an alternative configuration of analog-to-digital conversion stage 100 suitable for use in an application in which upstream circuitry comprises a sampling circuit (not shown) that causes analog input signal Ain to be relatively static, comparator 14 is connected to receive analog input signal Ain instead of analog signal sample As output by track-and-hold circuit 12. The alternative connection to the input of comparator 14 is indicated by a broken line 15 in FIG. 3. In the examples of analog-to-digital conversion stages 100, 300, 400, 401 and 500 described below and suitable for use in applications in which upstream circuitry comprises a sampling circuit (not shown) that causes analog input signal Ain to be relatively static, the comparator or comparators may also be connected to receive analog input signal Ain instead of analog signal sample As.

In the example of analog residual signal generator 120 shown in FIG. 3, selective inverter 130, summing element 140 and amplifier 150 are connected in series in order so that selective inverter 130 precedes summing element 140 and amplifier 150 follows summing element 140. In other examples, amplifier 150 is interposed between selective inverter 130 and switching element 140, as will be described below with reference to FIG. 5, or precedes selective inverter 130, as will be described in detail below with reference to FIG. 7.

Selective inverter 130 has a signal input 132, a control input 134 and an output 136. Signal input 132 provides the signal input of analog residual signal generator 120 and is connected to receive analog signal sample As from the output of track-and-hold circuit 12. Control input 134 provides the control input of analog residual signal generator 120 and is connected to receive bit signal Bout from the bit output of comparator 14. Selective inverter 130 operates in response to the first state of bit signal Bout to pass analog signal sample As unchanged, and operates in response to the second state of bit signal Bout to pass analog signal sample As with its polarity inverted, to generate a selectively-inverted analog signal Asi that it outputs at output 136. In other words, in the first state of bit signal Bout, selective inverter 130 operates in a non-inverting mode in which it generates selectively-inverted analog signal Asi by multiplying analog signal sample As by unity (+1), and, in the second state of bit signal Bout, selective inverter 130 operates in an inverting mode in which it generates selectively-inverted analog signal Asi by multiplying analog signal sample As by minus unity (−1).

Summing element 140 is a two-input summing element having a first input 142, a second input 144 and an output 146. First input 142 is connected to receive selectively-inverted analog signal Asi from the output 136 of selective inverter 130. Second input 144 is connected to receive a reference signal having a level equal to one-half of full-scale, i.e., Afs/2. Summing element 140 sums selectively-inverted analog signal Asi and the reference signal to generate an analog combined signal Ac that it outputs at output 146.

Amplifier 150 has an input 152 and an output 154. In this example, amplifier 150 has a gain nominally equal to two. Signal input 152 is connected to receive analog combined signal Ac from the output 146 of summing element 140. Output 154 provides the analog residual signal output of analog residual signal generator 120. Amplifier 150 amplifies analog combined signal Ar with a gain of two, and outputs the resulting analog residual signal Ares at output 154.

Operation of conversion stage 100 comprising analog residual signal generator 120 to convert analog input signal Ain to bit signal Bout and analog residual signal Ares for output to a following conversion stage will now be described with reference to the graphs shown in FIGS. 4A-4E. In the example shown, analog input signal Ain ranges in level from negative full scale −Afs to positive full-scale +Afs, and is a voltage or a current, as described above.

FIG. 4A is a graph showing the relationship between the level of analog signal sample As at the output of track-and-hold circuit 12 at the time that track clock signal TCK changes state and the level of analog input signal Ain.

FIG. 4B is a graph showing the relationship between the state of bit signal Bout at the bit output of comparator 14 and the level of analog input signal Ain. In the example shown, the threshold of comparator 14 is zero. Comparator 14 outputs bit signal Bout in a first state, i.e., logical zero in the example shown, when the level of analog signal sample As is less than its threshold and outputs bit signal Bout in a second state, i.e., logical one on the example shown, when the level of analog signal sample As is greater than its threshold. As noted above, when the level of analog input signal Ain and, hence, analog signal sample As, differs only slightly from the threshold of comparator 14, comparator 14 may take a substantial time to determine the state of bit signal Bout.

FIG. 4C is a graph showing the relationship between the level of selectively-inverted analog signal Asi at the output 136 of selective inverter 130 and that of analog input signal Ain. As the level of analog input signal Ain increases from negative full-scale to the threshold of comparator 14, i.e., zero in this example, the level of selectively-inverted analog signal Asi increases proportionally from −Afs to zero with a slope of +1. At this level of analog input signal Ain, the output of comparator 14 changes state, which causes selective inverter 130 to change from its non-inverting mode to its inverting mode. Consequently, as the level of the analog input signal continues to increase from the threshold of comparator 14 to positive full scale, the level of selectively-inverted analog signal Asi is the inverse of that of analog input signal Ain, and decreases proportionally from zero to −Afs with a slope of −1. For example, in response to analog input signal Ain having a level of +Afs/2, selective inverter 130 outputs selectively-inverted signal Asi at a level of −Afs/2. Note that, although the Ain/Asi transfer characteristic exhibits an inflection point at a level of analog input signal Ain equal to the threshold of comparator 14, the transfer characteristic exhibits no discontinuity at this level. Moreover, the level of selectively-inverted analog signal Asi does not change at this level of the analog input signal. Finally, note that, at the level of analog input signal Ain at which bit signal Bout changes state and, hence, selective inverter 130 changes from its non-inverting mode to its inverting mode, the level of selectively-inverted analog signal Asi at the output 136 of selective inverter 130 is independent of the state of bit signal Bout.

FIG. 4D is a graph showing the relationship between the level of analog combined signal Ac at the output 146 of summing element 140 and that of analog input signal Ain. Summing selectively-inverted analog signal Asi with the reference signal having a level of Afs/2 generates analog combined signal Ac shifted in level by +Afs/2 relative to selectively-inverted analog signal Asi. Thus, as the level of analog input signal Ain increases from negative full-scale to the threshold of comparator 14, i.e., zero in this example, the level of analog combined signal Ac increases proportionally from −Afs/2 to +Afs/2 with a slope of +1. Then, as the level of the analog input signal continues to increase from the threshold of comparator 14 to positive full-scale, the level of analog combined signal Ac decreases proportionally from +Afs/2 to −Afs/2 with a slope of −1. Again, although the Ain/Ac transfer characteristic exhibits an inflection point at a level of analog input signal Ain equal to the threshold of comparator 14, the transfer characteristic exhibits no discontinuity at this level. Moreover, at a level of analog input signal Ain equal to the threshold of comparator 14, the level of analog combined signal Ac is independent of the state of bit signal Bout.

FIG. 4E is a graph showing the relationship between the level of analog residual signal Ares at the output 154 of amplifier 150 and that of analog input signal Ain. FIG. 4E represents the overall transfer function of conversion stage 100 with respect to analog residual signal Ares. As the level of analog input signal Ain increases from negative full-scale to the threshold of comparator 14, i.e., zero in this example, the level of analog residual signal Ares increases proportionally from −Afs to +Afs with a slope of +2. Then, as the level of analog input signal Ain increases from the threshold of comparator 14 to positive full-scale, the level of analog residual signal Ares decreases proportionally from +Afs to −Afs with a slope of −2. Again, although the Ain/Ares transfer characteristic exhibits an inflection point at a level of analog input signal Ain equal to the threshold of comparator 14, the transfer characteristic exhibits no discontinuity at this level. Moreover, at a level of analog input signal Ain equal to the threshold of comparator 14, the level of analog residual signal Ares is independent of the state of bit signal Bout.

Thus, in conversion stage 100 comprising analog residual signal generator 120, when the level of analog input signal Ain is equal to the threshold of comparator 14, at which input level the comparator could become metastable, the Ain/Ares transfer function has the same value for both states of bit signal Bout. This makes the analog residual signal Ares output by an otherwise ideal conversion stage 100 completely insensitive to metastable states of comparator 14. More precisely, as noted above, it reduces the size of a conversion error due to metastable states to that of the offset and gain errors of the comparator(s) and the analog residual signal generator.

In the configuration shown, and provided that, in the metastable state of comparator 14, selectively-inverted analog signal Asi is independent of the state of bit signal Bout, the size of the metastable errors is limited to the offset and settling errors of conversion stage 100. If there are no offset and settling errors, and selective inverter 130 switches between its non-inverting and inverting states without imposing a glitch on selectively-inverted analog signal Asi, then conversion stage 100 will suppress the metastable errors completely. Moreover, in an ADC design without redundancy, conversion stage 100 completely suppresses metastable events provided that the offset and settling errors of the conversion stage are less than one least-significant bit (1 LSB), and that there are enough flip-flops in the digital signal path to which bit signal Bout is input to resolve the metastable states.

In analog-to-digital converters designed for redundancy, larger offset and settling errors may be present in the pipeline, but corrected by the redundancy. However, such offset and settling errors can be exposed by metastable events. Provided that the pipeline is designed not to exceed its redundancy range, the redundancy range can be taken as a worst case for a metastable event. However, the typical numbers will be much smaller because, for an error, e.g., an offset error, with standard deviation of P mV rms, a redundancy range of around 10*P mV peak-to-peak should be provided.

It can be seen from FIG. 4E that the level of analog residual signal Ares output by analog residual signal generator 120 crosses the threshold of the comparator of the conversion stage (not shown) following conversion stage 100 only twice as the level of analog input signal Ain increases from negative full-scale −Afs to positive full-scale +Afs. This occurs at levels of analog input signal Ain equal to −Afs/2 and +Afs/2. The same is true for all following conversion stages. Consequently, the bit signals generated by an analog-to-digital converter (not shown) composed of one or more conversion stages similar to conversion stage 100 collectively constitute a Gray-coded digital signal. Circuits for converting a Gray-coded digital signal to a binary-coded digital signal are known in the art. In applications that require a binary-coded digital signal, a suitable Gray-to-binary conversion circuit can be connected to receive the bit signals generated by the conversion stages similar to conversion stage 100. Such Gray-to-binary converter is used to convert the Gray-coded digital signal to a binary-coded digital signal. Similar remarks apply to the conversion stage examples described below with reference to FIGS. 5, 7, 11, 13, 15 and 16.

FIG. 5 is a block diagram showing another example of an analog-to-digital conversion stage 100 in accordance with an embodiment of the invention. Conversion stage 100 is composed of track-and-hold circuit 12, comparator 14 and an analog residual signal generator 160. Analog residual signal generator 160 is connected to receive analog signal sample As from track-and-hold circuit 12 and additionally to receive bit signal Bout from comparator 14. Analog residual signal generator 160 is operable to generate analog residual signal Ares from analog signal sample As and bit signal Bout such that, at a level of analog input signal Ain equal to the threshold of comparator 14, analog residual signal Ares has a level independent of the state of bit signal Bout.

Analog residual signal generator 160 is composed of selective inverter 130, summing element 140 and amplifier 150 connected in series, with the selective inverter preceding the summing element. In the example shown, selective inverter 130, amplifier 150 and summing element 140 are connected in series in the stated order.

Track-and-hold circuit 12 and comparator 14 are described above with reference to FIG. 1 and will not be described again in detail. Selective inverter 130, summing element 140 and amplifier 150 are described above with reference to FIG. 3. Amplifier 150 has a gain nominally equal to two, as described above with reference to FIG. 3. The input 152 of amplifier 150 is connected to receive selectively-inverted analog signal Asi from the output 136 of selective inverter 130. Amplifier 150 amplifies selectively-inverted analog signal Asi with a gain of two and outputs a resulting amplified analog signal Aa at its output 154.

The output 146 of summing element 140 provides the analog residual signal output of analog residual signal generator 160. The first input 142 of summing element 140 is connected to receive amplified analog signal Aa from the output 154 of amplifier 150. Second input 144 is connected to receive a reference signal having a level equal to full-scale, i.e., Afs. Summing element 140 sums amplified analog signal Aa and the reference signal to generate analog residual signal Ares that it outputs at output 146.

Operation of conversion stage 100 comprising analog residual signal generator 160 to convert an analog input signal Ain to bit signal Bout and analog residual signal Ares for output to a following conversion stage will now be described with reference to the graphs shown in FIGS. 6A-6E. In the example shown, analog input signal Ain ranges in level from negative full-scale −Afs to positive full-scale +Afs, and is a voltage or a current, as described above.

Figures 6A, 6B, 6C:
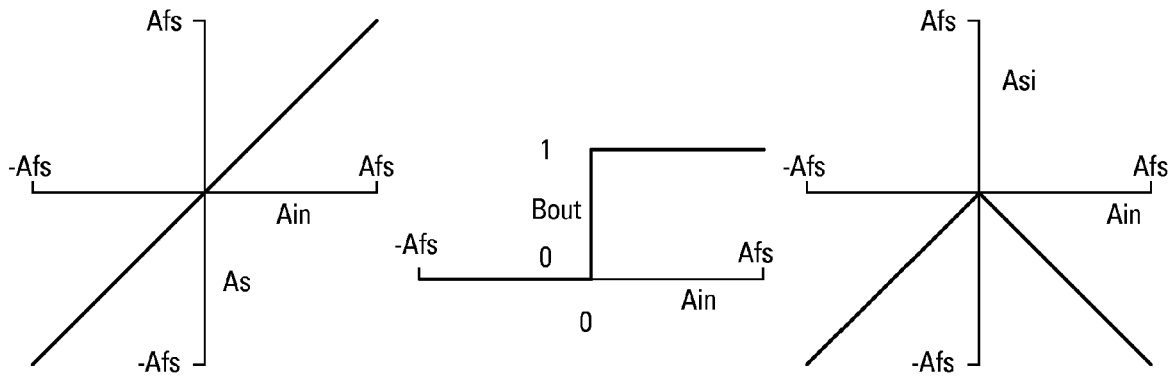
FIGS. 6A-6E are graphs illustrating the operation of the analog-to-digital conversion stage shown in FIG. 3.

FIG. 6A is a graph showing the relationship between the level of analog signal sample As at the output of track-and-hold circuit 12 at the time that track clock signal TCK changes state and the level of analog input signal Ain.

FIG. 6B is a graph showing the relationship between the state of bit signal Bout at the bit output of comparator 14 and the level of analog input signal Ain. In the example shown, the threshold of comparator 14 is zero. Comparator 14 outputs bit signal Bout in a first state, i.e., logical zero in the example shown, when the level of analog signal sample As is less than its threshold and outputs bit signal Bout in a second state, i.e., logical one in the example shown, when the level of analog signal sample As is greater than its threshold. As noted above, when the level of analog input signal Ain and, hence, analog signal sample As, differs only slightly from the threshold of comparator 14, comparator 14 may take a substantial time to determine the state of bit signal Bout.

FIG. 6C is a graph showing the relationship between the level of selectively-inverted analog signal Asi at the output 136 of selective inverter 130 and that of analog input signal Ain. This relationship is the same as that described above with reference to FIG. 4C, and will therefore not be described again here.

Figure 6D:
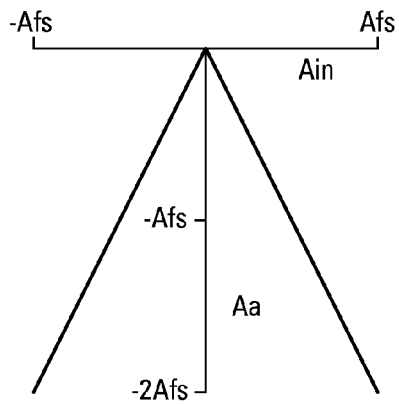

FIG. 6D is a graph showing the relationship between the level of amplified analog signal Aa at the output 154 of amplifier 150 and that of analog input signal Ain. As the level of analog input signal Ain increases from negative full-scale to the threshold of comparator 14, i.e., zero in this example, the level of analog residual signal Ares increases proportionally with a slope of 2 from −2Afs to zero with a slope of +2. Then, as the level of analog input signal Ain increases from the threshold of comparator 14 to positive full-scale, the level of amplified analog signal Aa decreases proportionally from zero to −2Afs with a slope of −2. Again, although the Ain/Aa transfer characteristic exhibits an inflection point at a level of analog input signal Ain equal to the threshold of comparator 14, the transfer characteristic exhibits no discontinuity at this level. Moreover, at a level of analog input signal Ain equal to the threshold of comparator 14, the level of amplified analog signal Aa is independent of the state of bit signal Bout.

Figure 6E:
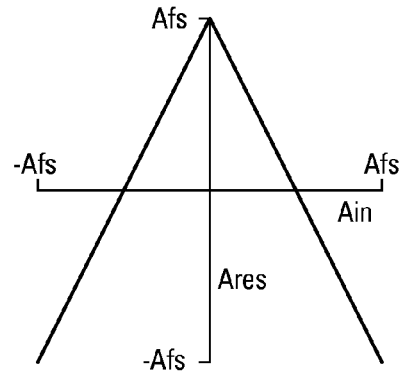

FIG. 6E is a graph showing the relationship between the level of analog residual signal Ares at the output 146 of summing element 140 and that of analog input signal Ain. FIG. 6E represents the overall transfer function of conversion stage 100 with respect to analog residual signal Ares. Summing amplified analog signal Aa with the reference signal having a level of Afs generates analog residual signal Ares shifted in level by +Afs relative to amplified analog signal Aa. Thus, as the level of analog input signal Ain increases from negative full-scale to the threshold of comparator 14, i.e., zero in this example, the level of analog residual signal Ares increases from −Afs to +Afs with a slope of +2. Then, as the level of the analog input signal continues to increase from the threshold of comparator 14 to positive full-scale, the level of analog residual signal Ares decreases proportionally from +Afs to −Afs with a slope of −2. Again, although the Ain/Ares transfer characteristic exhibits an inflection point at a level of analog input signal Ain equal to the threshold of comparator 14, the transfer characteristic exhibits no discontinuity at this level. Moreover, at a level of analog input signal Ain equal to the threshold of comparator 14, the level of analog residual signal Ares is independent of the state of bit signal Bout.

Thus, in conversion stage 100 comprising analog residual signal generator 160, when the level of analog input signal Ain is equal to the threshold of comparator 14, at which input level the comparator could become metastable, the Ain/Ares transfer function shown in FIG. 6E has the same value for both states of bit signal Bout. This makes the analog residual signal Ares output by conversion stage 100 completely insensitive to metastable states of comparator 14.

FIG. 7 is a block diagram showing another example of analog-to-digital conversion stage 100 in accordance with an embodiment of the invention. Conversion stage 100 is composed of track-and-hold circuit 12, comparator 14 and an analog residual signal generator 170. Analog residual signal generator 170 is connected to receive analog signal sample As from track-and-hold circuit 12 and additionally to receive bit signal Bout from comparator 14. Analog residual signal generator 170 is operable to generate analog residual signal Ares from analog signal sample As and bit signal Bout such that, at a level of analog input signal Ain equal to the threshold of comparator 14, analog residual signal Ares has a level independent of the state of bit signal Bout.

Analog residual signal generator 170 is composed of selective inverter 130, summing element 140 and amplifier 150 connected in series, with selective inverter 130 preceding summing element 140. In the example shown, amplifier 150, selective inverter 130 and summing element 140 are connected in series in the stated order.

Track-and-hold circuit 12 and comparator 14 are described above with reference to FIG. 1 and will not be described again in detail. Selective inverter 130, summing element 140 and amplifier 150 are described above with reference to FIG. 3 and will not be described again in detail. Amplifier 150 has a gain nominally equal to two, as described above with reference to FIG. 3. The input 152 of amplifier 150 provides the signal input of analog residual signal generator 170 and is connected to receive analog signal sample As from the output of track-and-hold circuit 12. Amplifier 150 amplifies analog signal sample As with a gain of two and outputs an resulting amplified analog signal Aa at output 154.

The signal input 132 of selective inverter 130 is connected to receive amplified signal Aa from the output 154 of amplifier 150. Selective inverter 130 operates in response to bit signal Bout received at control input 134 to selectively invert amplified signal Aa to generate selectively-inverted analog signal Asi. Selective inverter 130 outputs selectively-inverted analog signal Asi at output 136.

The first input 142 of summing element 140 is connected to receive selectively-inverted analog signal Asi from the output 136 of selective inverter 130. Second input 144 is connected to receive a reference signal having a level equal to full-scale, i.e., Afs. Summing element 140 sums selectively-inverted analog signal Asi and the reference signal to generate analog residual signal Ares that it outputs at output 146. Output 146 provides the analog residual signal output of analog residual signal generator 170.

Operation of conversion stage 100 comprising analog residual signal generator 170 to convert an analog input signal Ain to bit signal Bout and analog residual signal Ares for output to a following conversion stage will now be described with reference to the graphs shown in FIGS. 8A-8E. In the example shown, analog input signal Ain ranges in level from negative full-scale −Afs to positive full-scale +Afs, and is a voltage or a current, as described above.

FIG. 8A is a graph showing the relationship between the level of analog signal sample As at the output of track-and-hold circuit 12 at the time that track clock signal TCK changes state and the level of analog input signal Ain.

FIG. 8B is a graph showing the relationship between the state of bit signal Bout at the bit output of comparator 14 and the level of analog input signal Ain. In the example shown, the threshold of comparator 14 is zero. Comparator 14 outputs bit signal Bout in a first state, i.e., logical zero in the example shown, when the level of analog signal sample As is less than its threshold and outputs bit signal Bout in a second state, i.e., logical zero in the example shown, when the level of analog signal sample As is greater than its threshold. As noted above, when the level of analog input signal Ain and, hence, analog signal sample As, differs only slightly from the threshold of comparator 14, comparator 14 may take a substantial time to determine the state of bit signal Bout.

FIG. 8C is a graph showing the relationship between the level of amplified analog signal Aa at the output 154 of amplifier 150 and that of analog input signal Ain. As the level of analog input signal Ain increases from negative full-scale to positive full-scale, the level of amplified analog signal Aa increases proportionally with a slope of +2 from −2Afs to +2Afs. The level of amplified analog signal Aa is zero when the level of analog input signal Ain is zero.

FIG. 8D is a graph showing the relationship between the level of selectively-inverted analog signal Asi at the output 136 of selective inverter 130 and that of analog input signal Ain. As the level of analog input signal Ain increases from negative full-scale to the threshold of comparator 14, i.e., zero in this example, the level of selectively-inverted analog signal Asi increases proportionally from −2Afs to zero with a slope of +2. At this level of analog input signal Ain, the output of comparator 14 changes state, which causes selective inverter 130 to change from its non-inverting mode to its inverting mode. Consequently, as the level of the analog input signal continues to increase from the threshold of comparator 14 to positive full-scale, the level of selectively-inverted analog signal Asi is the inverse of that of amplified analog signal Aa, and decreases proportionally from zero to −2Afs with a slope of −2. For example, in response to amplified analog signal having a level of +Afs, selective inverter 130 outputs selectively-inverted signal Asi at a level of −Afs. Note that, although the Ain/Asi transfer characteristic exhibits an inflection point at a level of analog input signal Ain equal to the threshold of comparator 14, the transfer characteristic exhibits no discontinuity at this level. Moreover, the level of selectively-inverted analog signal Asi does not change at this level of the analog input signal. Finally, note that, at the level of analog input signal Ain at which bit signal Bout changes state and, hence, selective inverter 130 changes from its non-inverting mode to its inverting mode, the level of selectively-inverted analog signal Asi at the output 136 of selective inverter 130 is independent of the state of bit signal Bout.

FIG. 8E is a graph showing the relationship between the level of analog residual signal Ares at the output 146 of summing element 140 and that of analog input signal Ain. FIG. 8E represents the overall transfer function of conversion stage 100 with respect to analog residual signal Ares. Summing selectively-inverted analog signal Asi with the reference signal having a level of positive full-scale +Afs generates analog residual signal Ares with its level shifted by +Afs relative to that of selectively-inverted analog signal Asi. Thus, as the level of analog input signal Ain increases from negative full-scale to the threshold of comparator 14, i.e., zero in this example, the level of analog residual signal Ares increases proportionally from −Afs to +Afs with a slope of +2. Then, as the level of the analog input signal continues to increase from the threshold of comparator 14 to positive full-scale, the level of analog residual signal Ares decreases proportionally from +Afs to −Afs with a slope of −2. Again, although the Ain/Ares transfer characteristic exhibits an inflection point at a level of analog input signal Ain equal to the threshold of comparator 14, the transfer characteristic exhibits no discontinuity at this level. Moreover, at a level of analog input signal Ain equal to the threshold of comparator 14, the level of analog residual signal Ares is independent of the stage of bit signal Bout.

Thus, in conversion stage 100 comprising analog residual signal generator 170, when the level of analog input signal Ain is equal to the threshold of comparator 14, at which input level the comparator could become metastable, the Ain/Ares transfer function shown in FIG. 8E has the same value for both states of bit signal Bout. This makes the analog residual signal Ares output by conversion stage 100 completely insensitive to metastable states of comparator 14.

The analog circuitry constituting conversion stage 100 described above with reference to FIGS. 3, 5 and 7 is typically differential circuitry. In such embodiments, selective inverter 130 is implemented simply by connecting the true and complement terminals of signal input 132 to the true and complement terminals, respectively, of output 136 in one state of bit signal Bout, and connecting the true and complement terminals of signal input 132 to the complement and true terminals, respectively, of output 136 in the other state of bit signal Bout. This may be done using such circuits as a Gilbert cell or a bridge circuit, for example.

Figure 9:
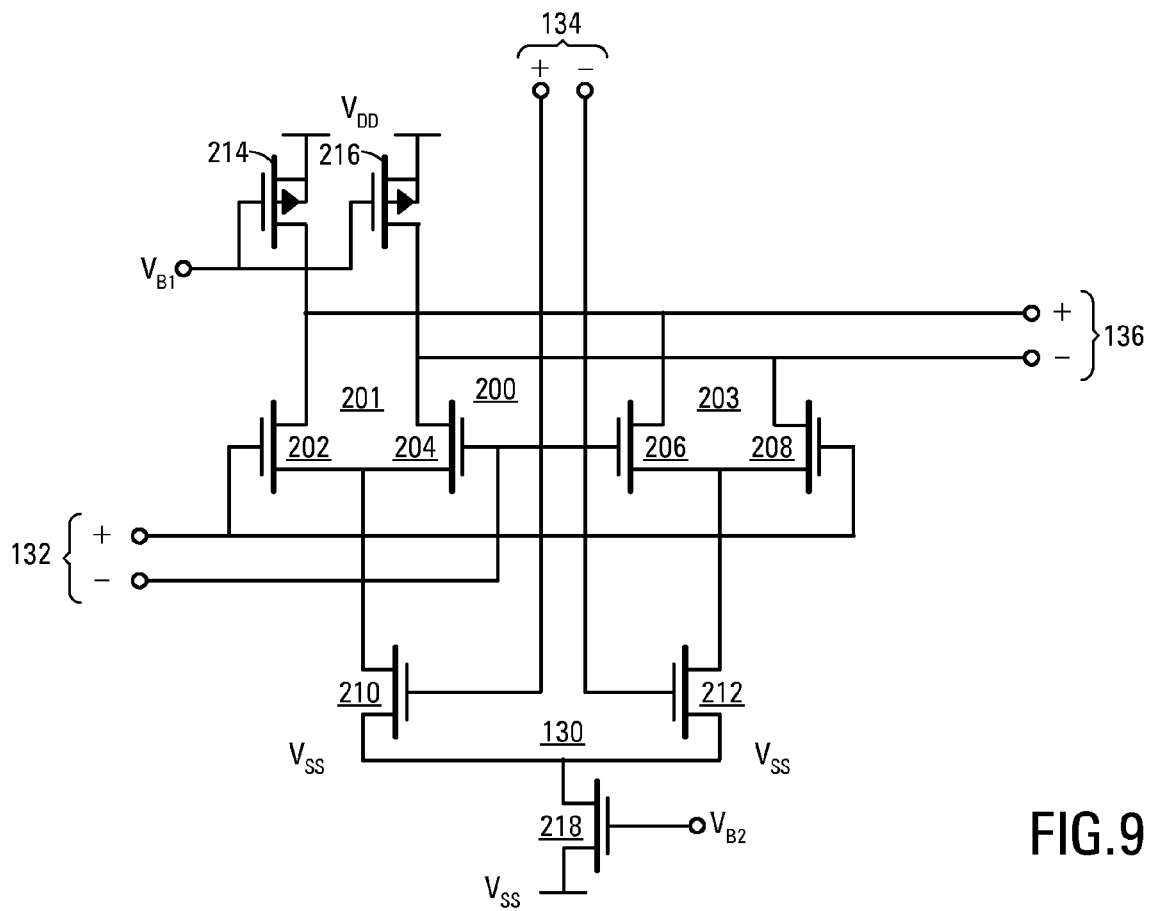
FIG. 9 is a block diagram showing an example of a selective inverter comprising a Gilbert cell.

FIG. 9 is a block diagram showing an example of selective inverter 130 comprising a Gilbert cell 200. In this example, the signal input 132, the control input 134 and the output 136 of selective inverter are all differential connections each having a true terminal, indicated by +, and a complement terminal, indicated by −.

Gilbert cell 200 is composed of four transistors 202, 204, 206 and 208, mode select transistors 210 and 212, and current sink transistor 218. The sources of transistors 202 and 204 are connected to the drain of mode select transistor 210. The sources of transistors 206 and 208 are connected to the drain of mode select transistor 212. The gates of transistors 202 and 208 are connected to the true terminal of signal input 132. The gates of transistors 204 and 206 are connected to the complement terminal of signal input 132. The drains of transistors 202 and 206 are connected to the drain of a load transistor 214 and to the true terminal of output 136. The drains of transistors 204 and 208 are connected to the drain of a load transistor 216 and to the complement terminal of output 136. The sources of load transistors 214 and 216 are connected to a supply voltage $V_{DD}$. The gates of load transistors 214 and 216 are connected to a first bias voltage $V_{B1}$. Mode select transistors 210 and 212 are connected as a differential pair with their sources connected to one another and to the drain of current sink transistor 218. The source of current sink transistor 218 is connected to a supply voltage $V_{SS}$. The gate of current sink transistor 218 is connected to a second bias voltage $V_{B2}$. The gate of mode select transistor 210 is connected to the true terminal of control input 134. The gate of mode select transistor 212 is connected to the complement terminal of control input 134.

Transistors 202 and 204, mode select transistor 210 and load transistors 214 and 216 collectively constitute a first differential stage 201 and transistors 206 and 208, mode select transistor 212 and load transistors 214 and 216 collectively constitute a second differential stage 203. Each differential stage is inverting between the gate and drain of a given one of transistors 204, 206, 206 and 208. However, the differential stages are differently connected between signal input 132 and output 136. Differential stage 201 is connected to be inverting between signal input 132 and output 136, whereas differential stage 203 is connected to be non-inverting between signal input 132 and output 136.

Control input 134 is connected to receive bit signal Bout from the output of comparator 14 (FIG. 3). A first state of bit signal Bout sets the gate of mode select 210 to a level lower than that of mode select transistor 212. This turns mode select transistor 210 off, which inactivates differential stage 201, and turns mode select transistor 212 on, which activates differential stage 203. Consequently, with the first state of bit signal Bout applied to control input 134, differential stage 203 passes a signal received at signal input 132 to output 136. Differential stage 203 is non-inverting. Hence, selective inverter 130 is non-inverting in the first state of bit signal Bout.

A second state of bit signal Bout sets the gate of mode select transistor 210 to a level higher than that of mode select transistor 210. This turns mode select transistor 210 on, which activates differential stage 201, and turns mode select transistor 212 off, which inactivates differential stage 203. Consequently, in the second state of bit signal Bout applied to control input 134, differential stage 201 passes a signal received at signal input 132 to output 136. Differential stage 201 is inverting. Hence, selective inverter 130 is inverting in the second state of bit signal Bout.

Transistors 202, 204, 206, 208, 210, 212, 214, 216 and 218 are structured such that selective inverter 130 has a gain of unity in both its inverting and non-inverting states. Alternatively, transistors 202, 204, 206, 208, 210, 212, 214, 216 and 218 can be structured to provide a circuit having a gain of two in both its inverting and non-inverting states. Such circuit provides the functions of both selective inverter 130 and amplifier 150 in analog residual signal generators 160 and 170 described above with reference to FIGS. 5 and 7, respectively, and will be regarded as being composed of a selective inverter and an amplifier. Selective inverter 200 could also be implemented using bipolar junction transistors, or bipolar junction transistors and resistors.

In an example in which the signals are single-ended, the complement terminal of signal input 132 is connected to a bias voltage (not shown), the complement terminals of control input 134 and output 136 are omitted, and the gate of mode select transistor 212 is connected to the true terminal of control input 134 though an inverter (not shown).

Figure 10:
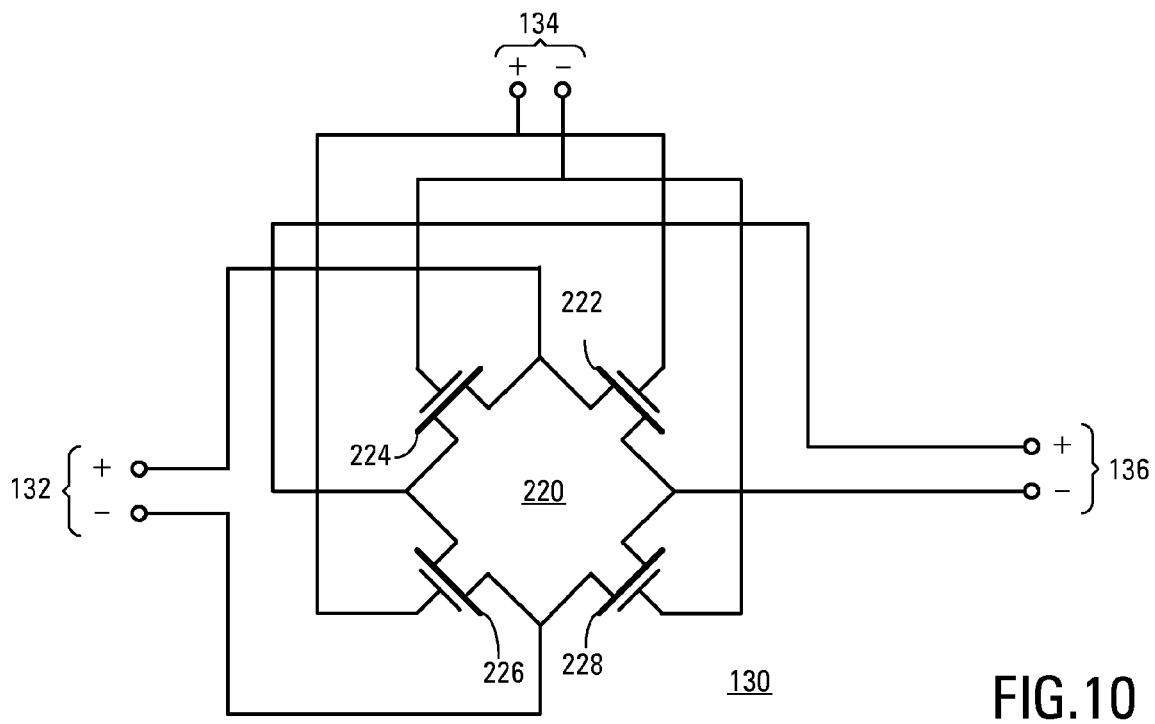
FIG. 10 is a schematic diagram showing an example of a selective inverter comprising a bridge circuit.

FIG. 10 is a schematic diagram showing an example of selective inverter 130 comprising a bridge circuit 220. Bridge circuit 220 is composed of transistors 222, 224, 226 and 228 connected in a bridge configuration. The true (+) terminal of signal input 132 is connected to a node between transistors 222 and 224, the complement (−) terminal of signal input 132 is connected to a node between transistors 226 and 228, the true (+) terminal of output 136 is connected to a node between transistors 224 and 226 and the complement (−) terminal of output 136 is connected to a node between transistors 222 and 228. The gates of transistors 222 and 226 are connected to the true terminal of control input 134 and the gates of transistors 224 and 228 are connected to the complement terminal of control input 134. Control input 134 is connected to receive bit signal Bout from the output of comparator 14 (FIG. 3).

A first state of bit signal Bout sets the true terminal of control input 134 to a low state that turns transistors 222 and 226 off and sets the complement terminal to a high state that turns transistors 224 and 228 on. The on state of transistor 224 connects the true terminal of signal input 132 to the true terminal of output 136 and the on state of transistor 228 connects the complement terminal of signal input 132 to the complement terminal of output 136. Consequently, with the first state of bit signal Bout applied to control input 134, selective inverter 130 is non-inverting.

A second state of bit signal Bout sets the true terminal of control input 134 to a high state that turns transistors 222 and 226 on and sets the complement terminal to a low state that turns transistors 224 and 228 off. The on state of transistor 222 connects the true terminal of signal input 132 to the complement terminal of output 136 and the on state of transistor 226 connects the complement terminal of signal input 132 to the true terminal of output 136. Consequently, with the second state of bit signal Bout applied to control input 134, selective inverter 130 is inverting.

In implementations in which the signal received at the first input 142 of summing element 140 is a current and the reference received at second input 144 of summing element 140 is a current and summing element 140 sums these currents at a node, selective inverter 130 should operate in a way prevents the true and complement signals from being shorted together momentarily. Such an event would cause an undesirable glitch in analog residual signal Ares when a metastable state of comparator 14 is resolved. To prevent such an occurrence, either or both of selective inverter 130 and summing element 140 should be implemented as a unilateral circuit with a low gain from output to input. The Gilbert cell implementation of selective inverter 130 described above with reference to FIG. 9 meets this requirement if transistors 202, 204, 206 and 208 are biased in saturation when on. The bridge implementation of selective inverter 130 described above with reference to FIG. 10 meets this requirement provided that no more than two transistors are turned on at a time, even momentarily. In some implementations, additional circuitry (not shown) is provided to control the voltages applied to the gates of the opposed pairs of transistors 222, 226 and 224, 228 so that this condition is met. The example shown in FIG. 5, in which amplifier 150 is interposed between selective inverter 130 and summing element 140, meets this requirement regardless of the switching behavior of selective inverter 130.

Selective inverter 130 may be implemented differently from the examples described above with reference to FIGS. 9 and 10.

As noted above, in an ADC design without redundancy, the examples of conversion stage 100 described above with reference to FIGS. 3, 5 and 7 effectively completely suppress metastable events provided that the offset and settling errors of the conversion stage are less than one least-significant bit (1 LSB).

Using redundancy allows inaccuracies in the offsets of the comparators and residue formation to be tolerated. Redundancy hides such inaccuracies during normal operation, but metastable events can now have errors bounded by the redundancy range. A 1.5-bit-per-stage multi-stage ADC has a large redundancy range (up to +Afs/4). Consequently, metastable errors can in principle be this large. In practice, only an ADC with worst-case offsets (typically one in 103 to one in 105) will exhibit an error this large: the errors of typical ADCs are 6 to 10 times smaller.

Figure 11:
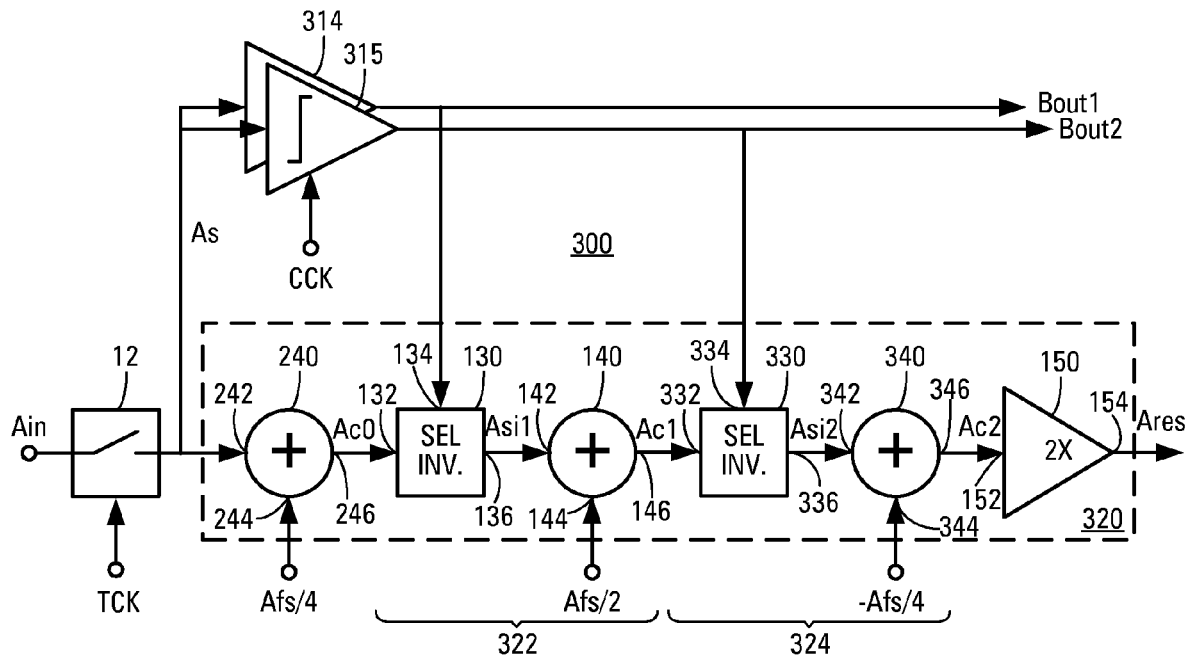
FIG. 11 is a block diagram showing an example of a 1.5-bits-per-stage analog-to-digital conversion stage in accordance with an embodiment of the invention.

The examples of conversion stage 100 described above with reference to FIGS. 3, 5 and 7 are one-bit-per-stage (one-level-per-stage) conversion stages. Other examples of a conversion stage in accordance with an embodiment of the invention have more than one level per stage and generate more than one bit per stage. FIG. 11 is a block diagram showing an example of a three-levels-per-stage (1.5-bits-per-stage) analog-to-digital conversion stage 300 in accordance with an embodiment of the invention. Elements of conversion stage 300 that correspond to elements of conversion stage 100 described above with reference to FIG. 3 are indicated using the same reference numerals and will not be described in detail again.

Conversion stage 300 is composed of track-and-hold circuit 12, a first comparator 314, a second comparator 315 and an analog residual signal generator 320. Analog residual signal generator 320 is connected to receive analog signal sample As from track-and-hold circuit 12, to receive a first bit signal Bout1 from first comparator 314 and to receive a second bit signal Bout2 from second comparator 315. Analog residual signal generator 320 operates to generate analog residual signal Ares from analog signal sample As, bit signal Bout1 and bit signal Bout2 such that, at levels of the analog input signal equal to the respective thresholds of first comparator 314 and second comparator 315, analog residual signal Ares has a level independent of the state of the respective bit signals.

Analog residual signal generator 320 is composed of an initial summing element 240, a first selective inversion stage 322 and second selective inversion stage 324 and an amplifier 150 connected in series. First selective inversion stage 322 is composed of a first selective inverter 130 and a first summing element 140. Second selective inversion stage 324 is composed of a second selective inverter 330 and a second summing element 340. First selective inverter 130 precedes first summing element 140 and second selective inverter 330 precedes second summing element 340. In the example shown, initial summing element 240, first selective inverter 130, first summing element 140, second selective inverter 330, second summing element 340 and amplifier 150 are connected in series in the order stated.

Track-and-hold circuit 12 is described above with reference to FIG. 1 and will not be described again in detail. The signal input of track-and-hold circuit 12 is connected to receive analog input signal Ain. Analog input signal Ain is a voltage or a current.

First comparator 314 and second comparator 315 are similar to comparator 14 described above with reference to FIG. 1, but differ in that first comparator 314 has a threshold equal to negative one-quarter of full-scale (−Afs/4) and second comparator 315 has a threshold equal to positive one-quarter of full-scale (+Afs/4). Each comparator operates in response to comparator clock signal CCK to compare the analog signal sample As output by track-and-hold circuit 12 with its respective threshold. First comparator 314 generates a first bit signal Bout1 in a first state, e.g., logical zero, when the level of analog signal sample As is less than its threshold (−Afs/4) and generates first bit signal Bout1 in a second state, e.g., logical one, when the level of analog signal sample As is greater than its threshold. Second comparator 315 generates a second bit signal Bout2 in a first state, e.g., logical zero, when the level of analog signal sample As is less than its threshold (+Afs/4) and generates second bit signal Bout2 in a second state, e.g., logical one, when the level of analog signal sample As is greater than its threshold. The respective threshold of first comparator 314 and second comparator 315 is a voltage or a current, depending on whether analog input signal Ain is a voltage or a current, respectively.

When the level of analog input signal Ain and, hence, analog signal sample As, differs only slightly from the threshold of first comparator 314, first comparator 314 may take a substantial time to determine the state of bit signal Bout1. Similarly, when the level of analog input signal Ain and, hence, analog signal sample As, differs only slightly from the threshold of second comparator 315, second comparator 315 may take a substantial time to determine the state of the bit signal Bout2.

In the example of analog residual signal generator 320 shown in FIG. 11, initial summing element 240, first selective inverter 130, first summing element 140, second selective inverter 330, second summing element 340 and amplifier 150 are connected in series in the stated order so that first selective inverter 130 precedes first summing element 140, second selective inverter 330 precedes second summing element 340 and amplifier 150 follows second summing element 340. In other examples, amplifier 150 precedes initial summing element 240 in a manner similar to that described above with reference to FIG. 7, or is interposed between any two of the elements constituting analog residual signal generator 320 in a manner similar to that described above with reference to FIG. 5. The magnitude of the reference signal received at the second input of any summing element following amplifier 150 is double that in the example shown in FIG. 11.

Initial summing element 240 is a two-input summing element having a first input 242, a second input 244 and an output 246. First input 242 provides the signal input of analog residual signal generator 320 and is connected to receive analog signal sample As from the output of track-and-hold circuit 12. Second input 244 is connected to receive an initial reference signal having a level equal to one-quarter of full-scale, i.e., Afs/4. Initial summing element 240 sums analog signal sample As and the initial reference signal to generate an initial analog combined signal Ac0 that it outputs at output 246.

First selective inverter 130 is described above with reference to FIG. 3. Signal input 132 is connected to receive initial analog combined signal Ac0 from the output 246 of initial summing element 240. Control input 134 provides a first control input of analog residual signal generator 320 and is connected to receive first bit signal Bout1 from the output of first comparator 314. First selective inverter 130 operates in response to the first state of first bit signal Bout1 to pass initial analog combined signal Ac0 unchanged and operates in response to the second state of first bit signal Bout1 to pass initial analog combined signal Ac0 with its polarity inverted to generate a first selectively-inverted analog signal Asi1 that it outputs at output 136. In other words, in the first state of first bit signal Bout1, selective inverter 130 operates in its non-inverting mode in which it generates first selectively-inverted analog signal Asi1 by multiplying initial combined analog signal Ac0 by unity (+1), and, in the second state of first bit signal Bout1, selective inverter 130 operates in its inverting mode in which it generates first selectively-inverted analog signal Asi1 by multiplying initial combined analog signal Ac0 by minus unity (−1).

First summing element 140 is described above with reference to FIG. 3. First input 142 is connected to receive first selectively-inverted analog signal Asi1 from the output 136 of first selective inverter 130. Second input 144 is connected to receive a first reference signal equal having a level equal to one-half of full-scale, i.e., Afs/2. First summing element 140 sums first selectively-inverted analog signal Asi1 and the first reference signal to generate a first analog combined signal Ac1 that it outputs at output 146.

Second selective inverter 330 is similar to selective inverter 130 described above with reference to FIG. 3 and has a signal input 332, a control input 334 and an output 336. Signal input 332 is connected to receive first analog combined signal Ac1 from the output 146 of first summing element 140. Control input 334 provides a second control input of analog residual signal generator 320 and is connected to receive second bit signal Bout2 from the output of second comparator 315. Second selective inverter 330 operates in response to the first state of second bit signal Bout2 to pass first analog combined signal Ac1 unchanged, and operates in response to the second state of second bit signal Bout2 to pass first analog combined signal Ac1 with its polarity inverted to generate a second selectively-inverted analog signal Asi2 that it outputs at output 336. In other words, in the first state of second bit signal Bout2, second selective inverter 330 operates in a non-inverting mode in which it generates second selectively-inverted analog signal Asi2 by multiplying first combined analog signal Ac1 by unity (+1), and, in the second state of second bit signal Bout2, selective inverter 330 operates in its inverting mode in which it generates second selectively-inverted analog signal Asi2 by multiplying first combined analog signal Ac1 by minus unity (−1).

Second summing element 340 is similar to summing element 140 described above with reference to FIG. 3 and has a first input 342, a second input 344 and an output 346. First input 342 is connected to receive second selectively-inverted analog signal Asi2 from the output 336 of second selective inverter 330. Second input 344 is connected to receive a second reference signal equal having a level equal to negative one-quarter of full-scale, i.e., −Afs/4. Second summing element 340 sums second selectively-inverted analog signal Asi2 and the second reference signal to generate a second analog combined signal Ac2 that it outputs at output 346.

Amplifier 150 has an input 152 and an output 154. In this example, amplifier 150 has a gain nominally equal to two, as described above. Signal input 152 is connected to receive second analog combined signal Ac2 from the output 346 of second summing element 340. Output 154 provides the analog residual signal output of analog residual signal generator 320. Amplifier 150 amplifies second analog combined signal Ac2 with a gain of two, and outputs the resulting analog residual signal Ares at output 154.

Operation of conversion stage 300 comprising analog residual signal generator 320 to convert analog input signal Ain to first bit signal Bout1, second bit signal Bout2 and an analog residual signal Ares for output to a following conversion stage will now be described with reference to the graphs shown in FIGS. 12A-12I. In the example shown, analog input signal Ain ranges in level from negative full-scale −Afs to positive full-scale +Afs, and is a voltage or a current, as described above.

Figure 12A:
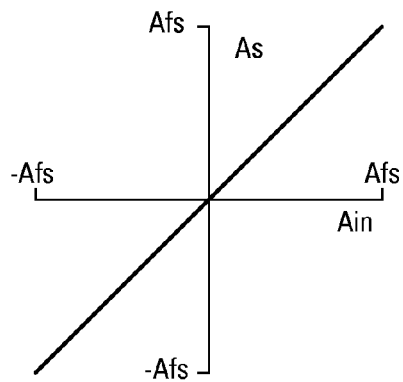
FIGS. 12A-12I are graphs illustrating the operation of the analog-to-digital conversion stage shown in FIG. 11.

FIG. 12A is a graph showing the relationship between the level of analog signal sample As at the output of track-and-hold circuit 12 at the time that track clock signal TCK changes state and the level of analog input signal Ain.

Figure 12B:
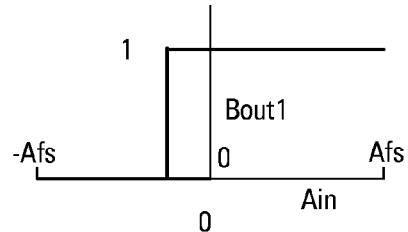

FIG. 12B is a graph showing the relationship between the state of first bit signal Bout1 at the output of first comparator 314 and the level of analog input signal Ain. In the example shown, the threshold of first comparator 314 is at a level equal to negative one-quarter of full-scale, i.e., −Afs/4. First comparator 314 outputs first bit signal Bout1 in a first state, i.e., logical zero in the example shown, when the level of analog signal sample As is less than its threshold, i.e., −Afs/4, and outputs first bit signal Bout1 in a second state, i.e., logical one in the example shown, when the level of analog signal sample As is greater than its threshold. As noted above, when the level of analog input signal Ain and, hence, analog signal sample As, differs only slightly from the threshold of first comparator 314, first comparator 314 may take a substantial time to determine the state of first bit signal Bout1.

Figure 12C:
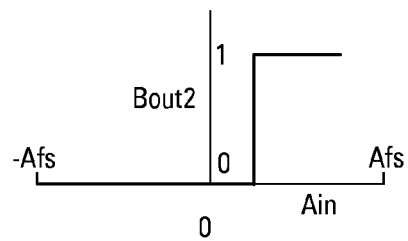

FIG. 12C is a graph showing the relationship between the state of second bit signal Bout2 at the output of second comparator 315 and the level of analog input signal Ain. In the example shown, the threshold of second comparator 315 is at a level equal to positive one-quarter of full-scale +Afs/4. Second comparator 315 outputs second bit signal Bout2 in a first state, i.e., logical zero in the example shown, when the level of analog signal sample As is less than its threshold, i.e., +Afs/4, and outputs second bit signal Bout2 in a second state, i.e., logical one in the example shown, when the level of analog signal sample As is greater than its threshold. As noted above, when the level of analog input signal Ain and, hence, analog signal sample As, differs only slightly from the threshold of second comparator 315, second comparator 315 may take a substantial time to determine the state of second bit signal Bout2.

Figure 12D:
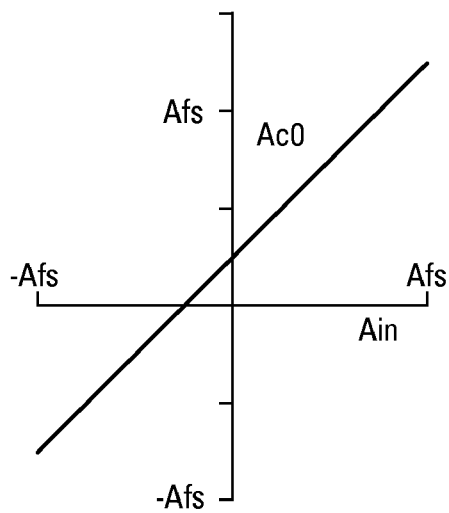

FIG. 12D is a graph showing the relationship between the level of initial analog combined signal Ac0 at the output 246 of initial summing element 240 and that of analog input signal Ain. Summing analog signal sample As with the initial reference signal having a level of +Afs/4 generates initial analog combined signal Ac0 shifted in level by +Afs/4 relative to analog signal sample As. Thus, as the level of analog input signal Ain increases from negative full-scale to positive full-scale, the level of initial analog combined signal Ac0 increases from −3Afs/4 to +5Afs/4 with a slope of +1.

Figure 12E:
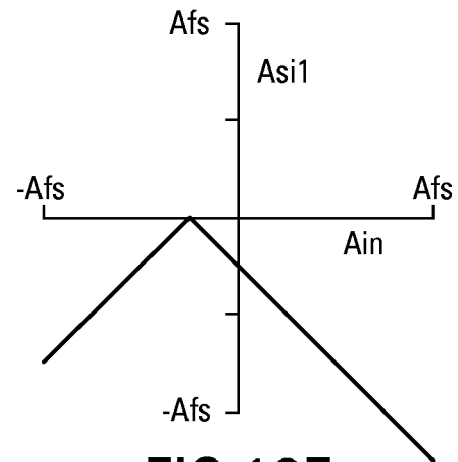

FIG. 12E is a graph showing the relationship between the level of first selectively-inverted analog signal Asi1 at the output 136 of first selective inverter 130 and that of analog input signal Ain. As the level of analog input signal Ain increases from negative full-scale to the threshold of first comparator 314, i.e., −Afs/4 in this example, the level of first selectively-inverted analog signal Asi increases proportionally from −3Afs/4 to zero with a slope of +1. At this level of analog input signal Ain, the output of first comparator 314 changes state, which causes first selective inverter 130 to change from its non-inverting mode to its inverting mode. Consequently, as the level of the analog input signal continues to increase from the threshold of first comparator 314 to positive full-scale, the level of first selectively-inverted analog signal Asi1 is the inverse of that of the analog input signal and decreases proportionally from zero to −5Afs/4 with a slope of −1. Note that, although the Ain/Asi1 transfer characteristic exhibits an inflection point at a level of analog input signal Ain equal to the threshold of first comparator 314, the transfer characteristic exhibits no discontinuity at this level. Moreover, the level of first selectively-inverted analog signal Asi1 does not change at this level of the analog input signal. Finally, note that, at the level of analog input signal Ain at which bit signal Bout1 changes state and, hence, first selective inverter 130 changes from its non-inverting mode to its inverting mode, the level of first selectively-inverted analog signal Asi1 at the output 136 of first selective inverter 130 is independent of the state of bit signal Bout1.

Figure 12F:
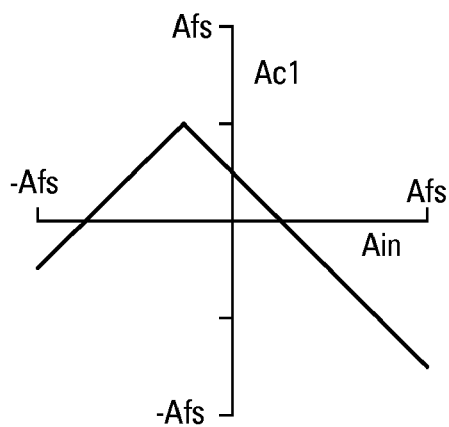

FIG. 12F is a graph showing the relationship between the level of first analog combined signal Ac1 at the output 146 of first summing element 140 and that of analog input signal Ain. Summing first selectively-inverted analog signal Asi1 with the first reference signal having a level of +Afs/2 generates first analog combined signal Ac1 shifted in level by +Afs/2 relative to first selectively-inverted analog signal Asi1. Thus, as the level of analog input signal Ain increases from negative full-scale to the threshold of first comparator 314, i.e., −Afs/4 in this example, the level of first analog combined signal Ac1 increases proportionally from −Afs/4 to +Afs/2 with a slope of +1. Then, as the level of the analog input signal continues to increase from the threshold of first comparator 314 to positive full-scale, the level of first analog combined signal Ac1 decreases proportionally from +Afs/2 to −3Afs/4 with a slope of −1. Again, although the Ain/Ac1 transfer characteristic exhibits an inflection point at a level of analog input signal Ain equal to the threshold of first comparator 314, the transfer characteristic exhibits no discontinuity at this level. Moreover, at a level of analog input signal Ain equal to the threshold of first comparator 314, the level of first analog combined signal Ac1 is independent of the state of bit signal Bout1.

Figure 12G:
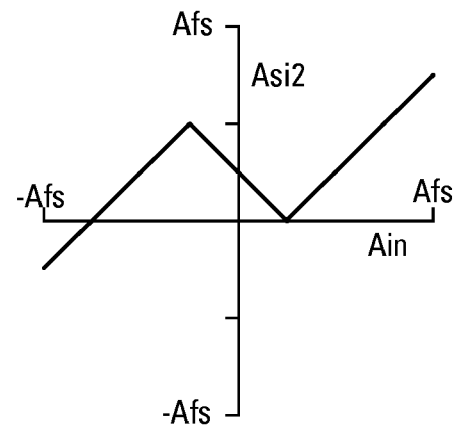

FIG. 12G is a graph showing the relationship between the level of second selectively-inverted analog signal Asi2 at the output 336 of second selective inverter 330 and that of analog input signal Ain. As the level of analog input signal Ain increases from negative full-scale to the threshold of second comparator 315, i.e., +Afs/4 in this example, the level of second selectively-inverted signal Asi2 follows that of first analog combined signal Ac1. Thus, as the level of analog input signal Ain increases from negative full-scale to the threshold of first comparator 314, i.e., −Afs/4 in this example, the level of second selectively-inverted analog signal Asi increases proportionally from −3Afs/4 to zero with a slope of +1, as described above. Then, as the level of the analog input signal increases from the threshold of first comparator 314 to the threshold of second comparator 315, the level of second selectively-inverted analog signal Asi2 decreases proportionally from +Afs/2 to zero with a slope of −1. At this level of analog input signal Ain, the output of second comparator 315 changes state, which causes second selective inverter 330 to change from its non-inverting mode to its inverting mode. Consequently, as the level of the analog input signal continues to increase from the threshold of second comparator 315 to positive full-scale, the level of second selectively-inverted analog signal Asi2 changes in the same sense as that of the analog input signal due to the analog input signal being inverted by both selective inverter 130 and selective inverter 330. Second selectively-inverted analog signal Asi2 therefore increases proportionally from zero to Afs/2 with a slope of +1 as the level of the analog input signal increases from the threshold of second comparator 315 to positive full-scale. Note that, although the Ain/Asi2 transfer characteristic exhibits inflection points at levels of analog input signal Ain equal to the respective thresholds of first comparator 314 and second comparator 315, the transfer characteristic exhibits no discontinuities at these levels. Moreover, the level of second selectively-inverted analog signal Asi2 does not change at these levels of the analog input signal. Finally, note that, at the level of analog input signal Ain at which second bit signal Bout2 changes state and, hence, second selective inverter 330 changes from its non-inverting mode to its inverting mode, the level of second selectively-inverted analog signal Asi2 at the output 336 of second selective inverter 330 is independent of the state of bit signal Bout2.

Figure 12H:
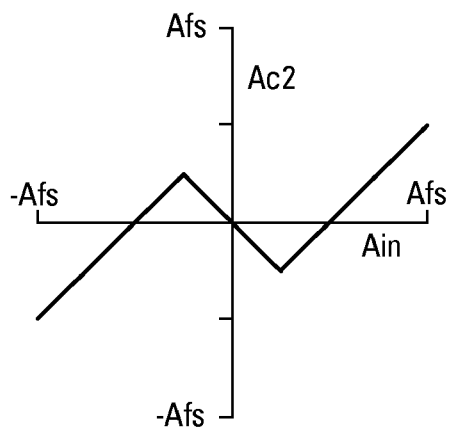

FIG. 12H is a graph showing the relationship between the level of second analog combined signal Ac2 at the output 346 of second summing element 340 and that of analog input signal Ain. Summing second selectively-inverted analog signal Asi2 with the second reference signal having a level of −Afs/4 generates second analog combined signal Ac2 shifted in level by −Afs/4 relative to second selectively-inverted analog signal Asi2. Thus, as the level of analog input signal Ain increases from negative full-scale to the threshold of first comparator 314, i.e., −Afs/4 in this example, the level of second analog combined signal Ac2 increases proportionally from −Afs/2 to +Afs/4 with a slope of +1. Then, as the level of the analog input signal continues to increase from the threshold of first comparator 314 to the threshold of second comparator 315, i.e., +Afs/4 in this example, the level of second analog combined signal Ac2 decreases proportionally from +Afs/4 to −Afs/4 with a slope of −1. Then, as the level of analog input signal Ain increases from the threshold of second comparator 315 to positive full-scale, the level of second analog combined signal Ac2 increases proportionally from −Afs/4 to +Afs/2 with a slope of +1. Again, although the Ain/Ac2 transfer characteristic exhibits inflection points at levels of analog input signal Ain equal to the respective thresholds of first comparator 314 and second comparator 315, the transfer characteristic exhibits no discontinuities at these levels. Moreover, at a level of analog input signal Ain equal to the threshold of second comparator 315, the level of second analog combined signal Ac2 is independent of the states of bit signal Bout2.

Figure 12I:
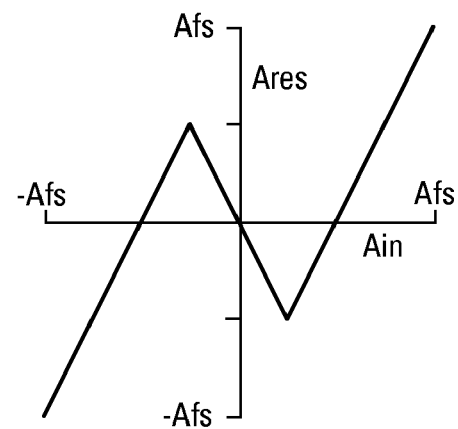

FIG. 12I is a graph showing the relationship between the level of analog residual signal Ares at the output 154 of amplifier 150 and that of analog input signal Ain. FIG. 12I represents the overall transfer function of conversion stage 300 with respect to analog residual signal Ares. As the level of analog input signal Ain increases from negative full-scale to the threshold of first comparator 314, i.e., −Afs/4 in this example, the level of analog residual signal Ares increases proportionally from −Afs to +Afs/2 with a slope of +2. Then, as the level of the analog input signal increases from the threshold of first comparator 314 to the threshold of second comparator 315, i.e., +Afs/4 in this example, the level of analog residual signal Ares decreases proportionally from +Afs/2 to −Afs/2 with a slope of −2. Finally, as the level of analog input signal Ain increases from the threshold of second comparator 315 to positive full-scale, the level of analog residual signal Ares increases proportionally from −Afs/2 to +Afs with a slope of +2. Again, although the transfer characteristic exhibits inflection points at levels of analog input signal Ain equal to the respective thresholds of first comparator 314 and second comparator 315, the transfer characteristic exhibits no discontinuities at these levels. Moreover, at levels of analog input signal Ain equal to the thresholds of first comparator 314 and second comparator 315, the level of analog residual signal Ares is independent of the state of bit signals Bout1 and Bout2 at these levels of the analog input signal.

Thus, in conversion stage 300 comprising analog residual signal generator 320, when the level of analog input signal Ain is equal to the threshold of first comparator 314, at which level the first comparator could become metastable, the Ain/Ares transfer function has the same value for both states of first bit signal Bout1. This makes the analog residual signal Ares output by conversion stage 300 insensitive to metastable states of first comparator 314. Similarly, when the level of analog input signal Ain is equal to the threshold of second comparator 315, at which level the second comparator could become metastable, the Ain/Ares transfer function has the same value for both states of second bit signal Bout2. This makes the analog residual signal Ares output by conversion stage 300 insensitive to metastable states of second comparator 315. However, if comparators 314 and 315 have offset errors, metastable conditions could result in such offset errors showing up in the digital output signal.

FIG. 13 is a block diagram showing an example of a four-levels-per-stage (two-bits-per-stage) analog-to-digital conversion stage 400 in accordance with an embodiment of the invention. Elements of conversion stage 400 that correspond to elements of conversion stages 100 and 300 described above with reference to FIGS. 3 and 11, respectively, are indicated using the same reference numerals and will not be described in detail again.

Conversion stage 400 is composed of track-and-hold circuit 12, a first comparator 414, a second comparator 415, a third comparator 416 and an analog residual signal generator 420. Analog residual signal generator 420 is connected to receive analog signal sample As from track-and-hold circuit 12, to receive first bit signal Bout1 from first comparator 414, to receive second bit signal Bout2 from second comparator 415 and to receive third bit signal Bout3 from third comparator 416. Analog residual signal generator 420 is operable to generate analog residual signal Ares from analog signal sample As, bit signal Bout1, bit signal Bout2 and bit signal Bout3 such that, at levels of the analog input signal equal to the respective thresholds of first comparator 414, second comparator 415 and third comparator 416, analog residual signal Ares has a level independent of the state of the respective bit signals.

Analog residual signal generator 420 is composed of an initial summing element 240, a first selective inversion stage 422, a second selective inversion stage 424, a third selective inversion stage 426 and an amplifier 450 connected in series. First selective inversion stage 422 is composed of a first selective inverter 130 and a first summing element 140. Second selective inversion stage 424 is composed of a second selective inverter 330 and a second summing element 340. Third selective inversion stage is composed of a third selective inverter 430 and a third summing element 440. In each of the selective inversion stages, the selective inverter precedes the summing element. In the example shown, initial summing element 240, first selective inverter 130, first summing element 140, second selective inverter 330, second summing element 340, third selective inverter 430, third summing element 440 and amplifier 450 are connected in series in the order stated.

Track-and-hold circuit 12 is described above with reference to FIG. 1 and will not be described again in detail. The signal input of track-and-hold circuit 12 is connected to receive analog input signal Ain. Analog input signal Ain is a voltage or a current.

First comparator 414, second comparator 415 and third comparator 416 are similar to comparator 14 described above with reference to FIG. 1, but first comparator 414 has a threshold equal to negative half full-scale (−Afs/2) and third comparator 416 has a threshold equal to positive half full-scale (+Afs/2). Similar to comparator 14, second comparator 415 has a threshold of zero. Each comparator operates in response to comparator clock signal CCK to compare the analog signal sample As output by track-and-hold circuit 12 with its respective threshold. First comparator 414 generates a first bit signal Bout1 in a first state, e.g., logical zero, when the level of analog signal sample As is less than its threshold (−Afs/2) and generates first bit signal Bout1 in a second state, e.g., logical one, when the level of analog signal sample As is greater than its threshold, as shown in FIG. 14A. Second comparator 415 generates a second bit signal Bout2 in a first state, e.g., logical zero, when the level of analog signal sample As is less than its threshold (zero) and generates second bit signal Bout2 in a second state, e.g., logical one, when the level of analog signal sample As is greater than its threshold, as shown in FIG. 14B. Third comparator 416 generates a third bit signal Bout3 in a first state, e.g., logical zero, when the level of analog signal sample As is less than its threshold (+Afs/2) and generates third bit signal Bout3 in a second state, e.g., logical one, when the level of analog signal sample As is greater than its threshold, as shown in FIG. 14C. The respective threshold of first comparator 414, second comparator 415 and third comparator 416 is a voltage or a current, depending on whether analog input signal Ain is a voltage or a current, respectively.

When the level of analog input signal Ain and, hence, analog signal sample As, differs only slightly from the threshold of first comparator 414, first comparator 414 may take a substantial time to determine the state of bit signal Bout1. Similarly, when the level of analog input signal Ain and, hence, analog signal sample As, differs only slightly from the threshold of second comparator 415, second comparator 415 may take a substantial time to determine the state of it signal Bout2. Finally, when the level of analog input signal Ain and, hence, analog signal sample As, differs only slightly from the threshold of third comparator 416, third comparator 416 may take a substantial time to determine the state of bit signal Bout3.

In other examples of analog residual signal generator 420, amplifier 450 precedes initial summing element 240 in a manner similar to that described above with reference to FIG. 7, or is interposed between any two of the elements constituting analog residual signal generator 420 in a manner similar to that described above with reference to FIG. 5. The magnitude of the reference signal received at the second input of any summing element following amplifier 450 is four times that in the example shown in FIG. 13. In a further variation, the gain of amplifier 450 may be provided by two amplifiers (not shown) each having a gain of two. The amplifiers may be located in any of the amplifier positions described above. The magnitudes of the references received by any summing elements downstream of the amplifiers should be adjusted accordingly.

Initial summing element 240, first selective inverter 130, first summing element 140, second selective inverter 330 and second summing element 340 are described above with reference to FIG. 11. In analog residual signal generator 420, the level of the initial reference signal received at the second input 244 of initial summing element 240 is equal to positive one-half of full-scale (+Afs/2), the level of the first reference signal received at the second input 144 of first summing element 140 is also equal to positive one-half of full-scale (+Afs/2), and the level of the second reference signal received at second input 344 of second summing element 340 is equal to negative one-half of full-scale (−Afs/2).

Third selective inverter 430 is similar to first selective inverter 130 described above with reference to FIG. 3 and has a signal input 432, a control input 434 and an output 436. Signal input 432 is connected to receive second analog combined signal Ac2 from the output 346 of second summing element 340. Control input 434 provides a third control input of analog residual signal generator 420 and is connected to receive third bit signal Bout3 from the bit output of third comparator 416. Third selective inverter 430 operates in response to the first state of third bit signal Bout3 to pass second analog combined signal Ac2 unchanged, and operates in response to the second state of third bit signal Bout3 to pass second analog combined signal Ac2 with its polarity inverted to generate a third selectively-inverted analog signal Asi3 that it outputs at output 436. In other words, in the first state of third bit signal Bout3, third selective inverter 430 operates in a non-inverting mode in which it generates third selectively-inverted analog signal Asi3 by multiplying second combined analog signal Ac2 by unity (+1), and, in the second state of third bit signal Bout3, third selective inverter 430 operates in its inverting mode in which it generates third selectively-inverted analog signal Asi3 by multiplying second combined analog signal Ac2 by minus unity (−1).

Third summing element 440 is similar to first summing element 140 described above with reference to FIG. 3 and has a first input 442, a second input 444 and an output 446. First input 442 is connected to receive third selectively-inverted analog signal Asi3 from the output 436 of third selective inverter 430. Second input 444 is connected to receive the third reference signal equal having a level equal to positive one-quarter of full-scale, i.e., +Afs/4. Third summing element 440 sums third selectively-inverted analog signal Asi3 and the third reference signal to generate a third analog combined signal Ac3 that it outputs at output 446.

Amplifier 450 has an input 452 and an output 454. In this example, amplifier 450 has a gain nominally equal to four. Input 452 is connected to receive third analog combined signal Ac3 from the output 446 of third summing element 440. Output 454 provides the analog residual signal output of analog residual signal generator 420. Amplifier 450 amplifies third analog combined signal Ac3 with a gain of four, and outputs the resulting analog residual signal Ares at output 454.

Operation of conversion stage 400 comprising analog residual signal generator 420 to convert analog input signal Ain to first bit signal Bout1, second bit signal Bout2, third bit signal Bout3 and analog residual signal Ares for output to a following conversion stage is similar to that described above with reference to FIGS. 12A-12I and will therefore not be described in detail. FIG. 14D shows the overall transfer function of conversion stage 400 between analog input signal Ain and analog residual signal Ares. When the level of analog input signal Ain is equal to the threshold of first comparator 414, i.e., −Afs/2, at which level the first comparator could become metastable, the Ain/Ares transfer function has the same value for both states of first bit signal Bout1. This makes the analog residual signal Ares output by conversion stage 400 completely insensitive to metastable states of first comparator 414. Similarly, when the level of analog input signal Ain is equal to the threshold of second comparator 415, i.e., zero, at which level the second comparator could become metastable, the Ain/Ares transfer function has the same value for both states of second bit signal Bout2. This makes the analog residual signal Ares output by conversion stage 400 completely insensitive to metastable states of second comparator 415. Finally, when the level of analog input signal Ain is equal to the threshold of third comparator 416, i.e., +Ain/2, at which input level the third comparator could become metastable, the Ain/Ares transfer function has the same value for both states of third bit signal Bout3. This makes the analog residual signal Ares output by conversion stage 400 completely insensitive to metastable states of third comparator 416.

The multi-bit conversion stage structure described above with reference to FIG. 13 can be extended to provide conversion stages having any specified number of levels per stage and generating a corresponding number of bits per stage. An example of a three-bit-per-stage (eight-levels-per-stage) conversion stage has seven comparators that collectively generate seven bit signals. The comparators have mutually-different thresholds offset from one another by twice full-scale divided by eight. The bit signals generated by the comparators are respectively numbered Bout1 through Bout7 in order of increasing thresholds of the comparators. The analog residual signal generator is composed of an initial summing element, seven selective inversion stages and an amplifier connected in series. Each of the selective inversion stages is composed of a selective inverter followed by a summing element. The amplifier typically has a gain of eight, although other values may be used. The initial summing element receives a reference signal equal to three-quarters of full-scale, i.e., +3Afs/4. In each selective inversion stage, the selective inverter operates in response to a respective one of the bit signals Bout1 through Bout 7. In each of the selective inversion stages that receive bit signals Bout1, Bout3 and Bout5, the selective inverter receives a respective reference signal having a level equal to positive one-quarter of full-scale, i.e., +Afs/4. In each of the selective inversion stages that receive bit signals Bout2, Bout4 and Bout6, the summing element receives a respective reference signal having a level equal to negative one-quarter of full-scale, i.e., −Afs/4. In the selective inversion stage that receives bit signal Bout7, the summing element receives a reference signal having a level equal to positive one-eighth of full-scale, i.e., +Afs/8.

To generalize, a conversion stage that has R levels per stage is composed of R−1 comparators that collectively generate R−1 bit signals. The comparators have mutually-different thresholds offset from one another by twice full-scale divided by R. The bit signals respectively generated by the comparators are assigned respective identification numbers 1 through R−1 in order of increasing thresholds of the comparators. The analog residual signal generator is composed of an initial summing element, R−1 selective inversion stages and an amplifier connected in series. The amplifier typically has a gain of R, although other values may be used. The initial summing element receives a reference signal equal to Afs(1−2/R). In a selective inversion stage numbered s, where s is an integer and $1 \leq s \leq (R-1)$, the selective inverter operates in response to a bit signal Bouts and the summing element receives a reference signal having a level equal to +2Afs/R when s is odd, −2Afs/R when s is even, and +Afs/R when s=(R−1).

Figure 15:
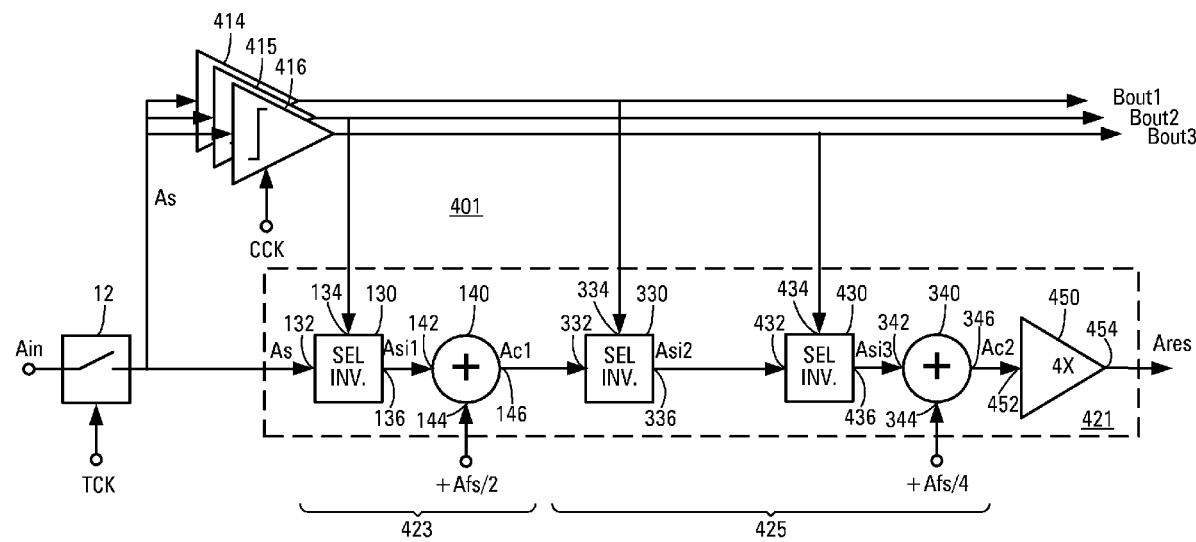
FIG. 15 is a block diagram showing an example of a simplified four-levels-per-stage analog-to-digital conversion stage in accordance with an embodiment of the invention.

FIG. 15 is a block diagram showing an example of a simplified four-levels-per-stage (two-bits-per-stage) analog-to-digital conversion stage 401 in accordance with an embodiment of the invention. Elements of conversion stage 401 that correspond to elements of conversion stage 400 described above with reference to FIG. 13 are indicated using the same reference numerals and will not be described in detail again.

Analog residual signal generator 421 is composed of a first selective inversion stage 423, a second selective inversion stage 425 and amplifier 450 connected in series. First selective inversion stage 423 is composed of first selective inverter 130 and first summing element 140. Second selective inversion stage 425 is composed of second selective inverter 330, third selective inverter 430 and second summing element 340. In each selective inversion stage, the selective inverter or selective inverters precede the summing element. In the example shown, first selective inverter 130, first summing element 140, second selective inverter 330, third selective inverter 430, second summing element 340 and amplifier 450 are connected in series in the order stated. Other arrangements are possible.

First comparator 414, second comparator 415 and third comparator 416 are described above with reference to FIG. 13. First comparator 414 has a threshold equal to negative one-half of full-scale (−Afs/2), second comparator 415 has a threshold equal to zero and third comparator 416 has a threshold equal to positive one-half of full-scale (+Afs/2). The states of bit signals Bout1, Bout2 and Bout3 respectively generated by comparators 414, 415 and 415 depend on the level of analog input signal Ain, as described above with reference to FIGS. 14A-14C, respectively.

In analog residual signal generator 421, the level of the first reference signal received at the second input 144 of first summing element 140 is equal to positive one-half of full-scale (+Afs/2), and the level of the second reference signal received at the second input 344 of second summing element 340 is equal to positive one-quarter of full-scale (+Afs/4). The signal input 132 of first selective inverter 130 provides the signal input of analog residual signal generator 421 and is connected to receive the analog signal sample As from track-and-hold circuit 12. The control input 134 of first selective inverter 130 provides a first control input of analog residual signal generator 421, and is connected to receive second bit signal Bout2 from the output of second comparator 415. The control input 334 of second selective inverter 330 provides a second control input of analog residual signal generator 421, and is connected to receive first bit signal Bout1 from the output of comparator 414. The control input 434 of third selective inverter 430 provides a third control input of analog residual signal generator 421, and is connected to receive third bit signal Bout3 from the output of comparator 416.

Compared with conversion stage 400, conversion stage 401 lacks initial summing element 240 because second bit signal Bout2 that controls first selective inverter 130 changes state when analog input signal Ain is equal to zero. First bit signal Bout1 that controls second selective inverter 330 changes state when analog input signal Ain is equal to −Afs/2. At this level of input signal Ain, the level of first combined signal Ac1 input to second selective inverter 330 is zero, since first selective inverter 130 is non-inverting at this level of the analog input signal. Third bit signal Bout3 that controls third selective inverter 430 changes state when analog input signal Ain is equal to +Afs/2. At this level of input signal Ain, the level of second selectively-inverted signal Ac2 input to third selective inverter 430 is again zero, because first selective inverter 130 is inverting at this level of the analog input signal. This effectively changes the sign of the reference signal received by first summing element 140, allowing the summing element that precedes third selective inverter 430 in conversion stage 400 to be omitted. Summing element 340 changes the level of third selectively-inverted signal Asi3 to make it symmetrical about zero level.

The multi-level-per-stage conversion stage structure described above with reference to FIG. 15 can be extended to provide conversion stages that have any specified number of levels per stage and that generate a corresponding number of bits per stage. A conversion stage that has R levels per stage, where R is an integer power of two, is composed of R−1 comparators that collectively generate R−1 bit signals. The comparators have mutually-different thresholds offset from one another by twice full-scale divided by R, and the bit signals respectively generated by the comparators are assigned respective identification numbers 1 through R−1 in order of increasing thresholds of the comparators, as described above. The analog residual signal generator is composed of P selective inversion stages, where P=$\log_2$R, and an amplifier connected in series. Each selective inversion stage is composed of a summing element preceded by one or more selective inverters. For example, in conversion stage 401 shown in FIG. 15, analog residual signal generator 421 has two selective inversion stages: selective inversion stage 423 composed of first selective inverter 130 and first summing element 140, and selective inversion stage 425 composed of second selective inverter 330, third selective inverter 430 and second summing element 340. The amplifier typically has a gain of R, although other values may be used.

A selective inversion stage numbered t, where t is an integer and $1 \leq t \leq P$, is composed of $2^{t-1}$ selective inverters and one summing element. Each of the selective inverters operates in response to a respective one of those of the bit signals whose identification numbers are each divisible by $R/2^t$ but not by $R/2^{t-1}$. The summing element is connected to receive a reference signal equal to positive full-scale divided by $2^t$, i.e., +Afs/$2^t$.

An embodiment of conversion stage 401 in which the number of levels R is not an integer power of two is composed of R−1 comparators that have mutually-different thresholds offset from one another by twice full-scale divided by R, as described above. Q is defined as $\log_2$R rounded up to the next integer, and S is defined as S=$2^Q$. The bit signals respectively generated by the comparators are assigned respective identification numbers 1 through R−1 in order of increasing thresholds of the comparators, also as described above. What will be called an MSB offset X is any integer from 0 to S−R, and is typically (S−R)/2 rounded to an integer. This choice of MSB offset X causes the bit signal that controls first selective inversion stage 423 to change state at a level near the midpoint of the range of analog input signal Ain, i.e., near a level of zero in this example. The analog residual signal generator is composed of Q selective inversion stages and amplifier 450. Each selective inversion stage is composed of a summing element preceded by one or more selective inverters. The amplifier typically has a gain of R, although other values may be used.

A selective inversion stage numbered t, where t is an integer and $1 \leq t \leq Q$, is composed of one summing element and as many as $2^{t-1}$ selective inverters. Each of the selective inverters operates in response to a respective one of those of the bit signals whose identification numbers plus X are each divisible by $2^Q/2^t$ but not by $2^Q/2^{t-1}$. In each selective inversion stage but the last (t<Q), the number of selective inverters is equal to $2^{t-1}$. Because R is less than $2^Q$, the number of selective inverters in the last selective inversion stage (t=Q) is less than ($2^{t-1}$), and selective inverters for which no corresponding bit signal exists are omitted. The summing element is connected to receive a reference signal equal to reference signal equal to positive full-scale divided by $2^t$, i.e., +Afs/$2^t$.

In a conversion stage having an odd number of levels, an initial summing element similar to initial summing element 240 described above with reference to FIG. 13 precedes selective inversion stage 423 and receives a reference signal equal to positive or negative full-scale divided by S, i.e., ±Afs/S, although other values may be used. The value can be different depending on whether redundancy is desired.

Figure 16:
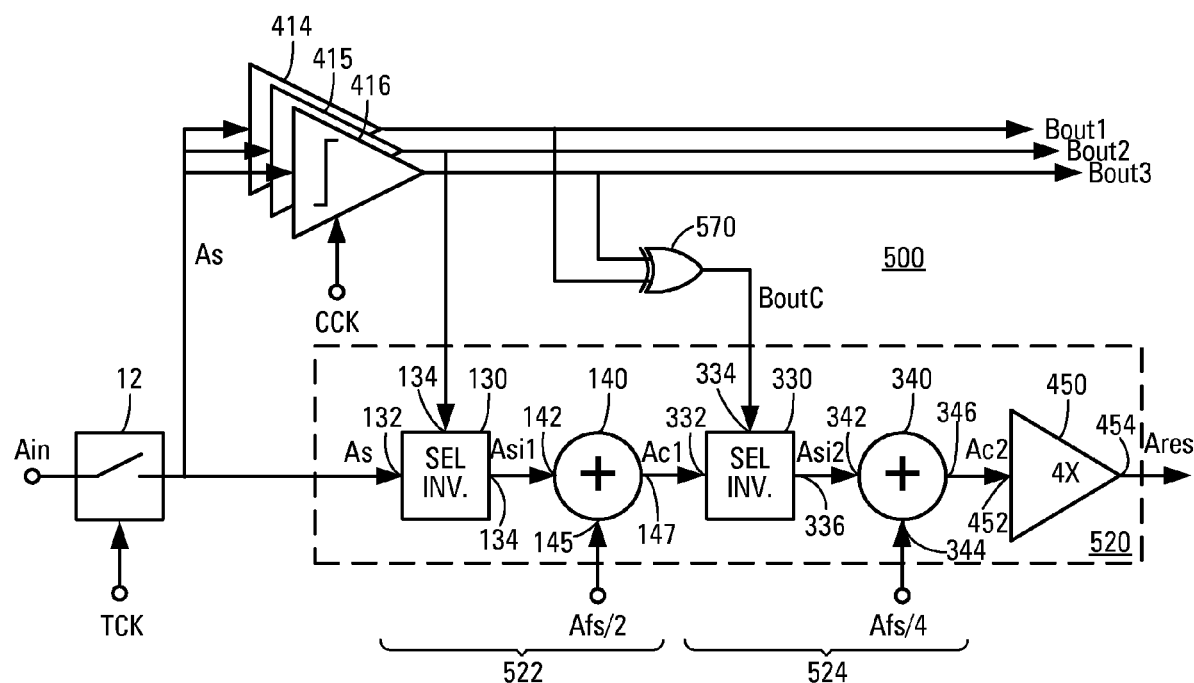
FIG. 16 is a block diagram showing an example of a further simplified four-levels-per-stage analog-to-digital conversion stage in accordance with an embodiment of the invention.

FIG. 16 is a block diagram showing an example of a further simplified four-levels-per-stage (two-bits-per-stage) analog-to-digital conversion stage 500 in accordance with an embodiment of the invention. Elements of conversion stage 500 that correspond to elements of conversion stages 100, 300 and 400 described above with reference to FIGS. 3, 11 and 13, respectively, are indicated using the same reference numerals and will not be described in detail again.

Conversion stage 400 is composed of track-and-hold circuit 12, first comparator 414, second comparator 415, third comparator 416, an exclusive-OR (XOR) gate 570 and an analog residual signal generator 520. Analog residual signal generator 520 is connected to receive analog signal sample As from track-and-hold circuit 12, and to receive bit signal Bout2 from comparator 415 and a combined bit signal BoutC derived by XOR gate 570 from bit signal Bout1 output by first comparator 414 and bit signal Bout3 output by third comparator 416. Analog residual signal generator 520 operates to generate analog residual signal Ares from analog signal sample As, bit signal Bout2 and bit signal BoutC such that, at levels of analog input signal Ain equal to the respective thresholds of first comparator 414, second comparator 415 and third comparator 416, the level of analog residual signal Ares is independent of the states of the bit signals respectively generated by comparators 414, 415 and 416.

Analog residual signal generator 520 is composed a first selective inversion stage 522, a second selective inversion stage 524 and amplifier 450 connected in series. First selective inversion stage 522 is composed of first selective inverter 130 and first summing element 140. Second inversion stage 524 is composed of second selective inverter 330 and second summing element 340. First selective inverter 130 precedes first summing element 140, and second selective inverter 330 precedes second summing element 340. In the example shown, first selective inverter 130, first summing element 140, second selective inverter 330, second summing element 340 and amplifier 450 are connected in series in the order stated. Other arrangements are possible, some of which will be described below.

Track-and-hold circuit 12 is described above with reference to FIG. 1 and will not be described again in detail. The signal input of track-and-hold circuit 12 is connected to receive analog input signal Ain. Analog input signal Ain is a voltage or a current.

First comparator 414, second comparator 415 and third comparator 416 are described above with reference to FIG. 13. First comparator 414 has a threshold equal to negative one-half of full-scale (−Afs/2), second comparator 415 has a threshold equal to zero and third comparator 416 has a threshold equal to positive one-half of full-scale (+Afs/2). The states of bit signals Bout1, Bout2 and Bout3 respectively generated by comparators 414, 415 and 415 depend on the level of analog input signal Ain, as described above with reference to FIGS. 14A-14C, respectively.

First selective inverter 130, first summing element 140, second selective inverter 330 and second summing element 340 are described above with reference to FIG. 11. In analog residual signal generator 520, the level of the first reference signal received at the second input 144 of first summing element 140 is also equal to positive one-half of full-scale (+Afs/2), and the level of the second reference signal received at second input 344 of second summing element 340 is equal to positive one-quarter of full-scale (Afs/4). The signal input 132 of first selective inverter 130 provides the signal input of analog residual signal generator 520 and is connected to receive the analog signal sample As from track-and-hold circuit 12. The control input 134 of first selective inverter 130 provides a first control input of analog residual signal generator 520, and is connected to receive second bit signal Bout2 from the output of second comparator 415. The control input 334 of second selective inverter 330 provides a second control input of analog residual signal generator 540, and is connected to receive combined bit signal BoutC from the output of XOR gate 570.

XOR gate 570 has two inputs and an output. The inputs are respectively connected to receive bit signals Bout1 and Bout3 from the outputs of first comparator 414 and third comparator 416.

Operation of conversion stage 500 comprising analog residual signal generator 520 to convert an analog input signal Ain to first bit signal Bout1, second bit signal Bout2 and third bit signal Bout3 and to provide analog residual signal Ares for output to a following conversion stage will now be described with reference to the graphs shown in FIGS. 17A-17G. In the example shown, analog input signal Ain ranges in level from negative full-scale −Afs to positive full-scale +Afs, and is a voltage or a current, as described above.

Figure 17A:
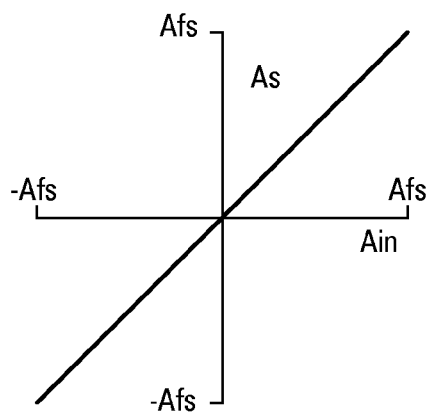
FIGS. 17A-17G are graphs illustrating the operation of the analog-to-digital conversion stage shown in FIG. 16.

FIG. 17A is a graph showing the relationship between the level of analog signal sample As at the output of track-and-hold circuit 12 at the time that track clock signal TCK changes state and the level of analog input signal Ain.

The relationship between the state of first bit signal Bout1 at the output of first comparator 414 and the level of analog input signal Ain is shown in FIG. 14A, the relationship between the state of second bit signal Bout2 at the output of second comparator 415 and the level of analog input signal Ain is shown in FIG. 14B and the relationship between the state of third bit signal Bout3 at the output of third comparator 416 and the level of analog input signal Ain is shown in FIG. 14C.

Figure 17B:
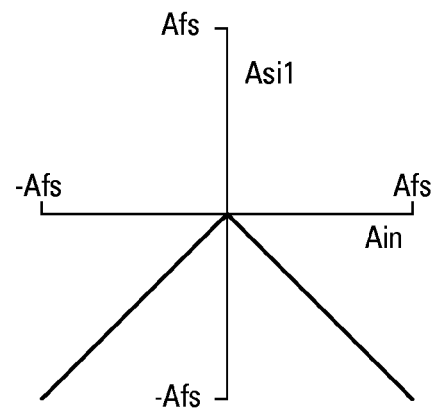

FIG. 17B is a graph showing the relationship between the level of first selectively-inverted analog signal Asi1 at the output 136 of first selective inverter 130 and that of analog input signal Ain. As the level of analog input signal Ain increases from negative full-scale to the threshold of second comparator 415, i.e., zero in this example, the level of first selectively-inverted analog signal Asi increases proportionally from −Afs to zero with a slope of +1. At this level of analog input signal Ain, the output of second comparator 415 changes state, which causes first selective inverter 130 to change from its non-inverting mode to its inverting mode. Consequently, as the level of the analog input signal increases from the threshold of second comparator 415 to positive full-scale, the level of first selectively-inverted analog signal Asi1 is the inverse of that of the analog input signal and decreases proportionally from zero to −Afs with a slope of −1. Note that, although the transfer characteristic exhibits an inflection point at a level of analog input signal equal to the threshold of second comparator 415, the transfer characteristic exhibits no discontinuity at this level. Moreover, the level of first selectively-inverted analog signal Asi1 does not change at this level of the analog input signal. Finally, note that, at the level of analog input signal Ain at which second bit signal Bout2 changes state and, hence, first selective inverter 130 changes from its non-inverting mode to its inverting mode, the level of first selectively-inverted analog signal Asi1 at the output 136 of first selective inverter 130 is independent of the state of second bit signal Bout2.

Figure 17C:
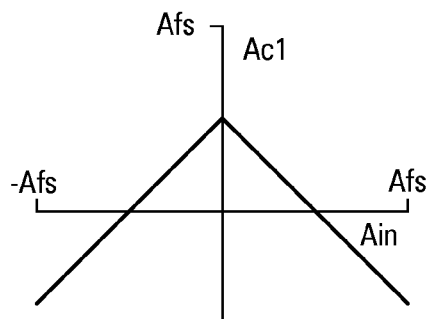

FIG. 17C is a graph showing the relationship between the level of first analog combined signal Ac1 at the output 146 of first summing element 140 and that of analog input signal Ain. Summing first selectively-inverted analog signal Asi1 with the first reference signal having a level of +Afs/2 generates first analog combined signal Ac1 shifted in level by +Afs/2 relative to first selectively-inverted analog signal Asi1. Thus, as the level of analog input signal Ain increases from negative full-scale to the threshold of second comparator 415, i.e., zero in this example, the level of first analog combined signal Ac1 increases proportionally from −Afs/2 to +Afs/2 with a slope of +1. Then, as the level of the analog input signal increases from the threshold of second comparator 415 to positive full-scale, the level of first analog combined signal Ac1 decreases proportionally from +Afs/2 to −Afs/2 with a slope of −1. Again, although the transfer characteristic exhibits an inflection point at a level of analog input signal equal to the threshold of first comparator 414, the transfer characteristic exhibits no discontinuity at this level. Moreover, at a level of analog input signal Ain equal to the threshold of second comparator 415, the level of first combined analog signal Ac1 is independent of the state of second bit signal Bout2.

Figure 17D:
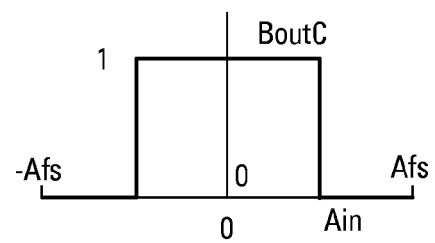

FIG. 17D is a graph showing the relationship between combined bit signal BoutC generated by XOR gate 570 from first bit signal Bout1 and third bit signal Bout3 and analog input signal Ain. Referring briefly to FIG. 14A, the state of first bit signal Bout1 is a logical 0 at levels of analog input signal Ain below the threshold of first comparator 414, i.e., −Afs/2 in this example, and is a logical 1 at levels of analog input signal Ain above the threshold of first comparator 414. Referring briefly to FIG. 14C, the state of third bit signal Bout3 is a logical 0 at levels of analog input signal Ain below the threshold of third comparator 416, i.e., +Afs/2 in this example, and is a logical 1 at levels of analog input signal Ain above the threshold of third comparator 416. Thus, as the level of analog input signal Ain increases from negative full-scale to the threshold of first comparator 414, bit signals Bout1 and Bout3 remain the same, and combined bit signal BoutC remains a logical 0. At the level of analog input signal equal to the threshold of first comparator 414, first bit signal Bout1 changes to a logical 1, and combined bit signal BoutC changes to logical 1 as a result. Combined bit signal BoutC remains a logical 1 as the level of analog input signal Ain increases from the threshold of first comparator 414 to the threshold of third comparator 416. At the level of analog input signal Ain equal to the threshold of third comparator 416, third bit signal Bout3 changes to a logical 1, and combined bit signal BoutC changes to logical 0 as a result. Combined bit signal BoutC remains a logical 0 as the level of analog input signal Ain increases from the threshold of third comparator 416 to positive full-scale.

Figure 17E:
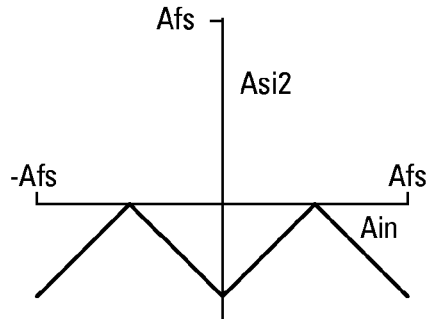

FIG. 17E is a graph showing the relationship between the level of second selectively-inverted analog signal Asi2 at the output 336 of second selective inverter 330 and that of analog input signal Ain. At levels of analog input signal Ain below the thresholds of first comparator 414 and third comparator 416, combined bit signal BoutC is in its logical zero state, as described above. Consequently, the logical zero stage of combined bit signal BoutC sets second selective inverter 330 to its non-inverting mode. Thus, as the level of analog input signal Ain increases from negative full-scale to the threshold of first comparator 414, i.e., −Afs/2 in this example, the level of second selectively-inverted analog signal Asi2 increases proportionally from −Afs/2 to zero with a slope of +1.

At a level of analog input signal Ain equal to the threshold of first comparator 414, first bit signal Bout output by first comparator 414 changes state, which causes combined bit signal BoutC to change state, as described above. The change in state of combined bit signal BoutC changes second selective inverter 330 from its non-inverting mode to its inverting mode. Consequently, as the level of analog input signal Ain increases from the threshold of first comparator 414 to the threshold of third comparator 416, i.e., +Afs/2 in this example, the level of second selectively-inverted analog signal Asi2 is the inverse of that of first analog combined signal Ac1. Thus, as the level of analog input signal increases from the threshold of first comparator 414 to the threshold of second comparator 415, the level of second selectively-inverted analog signal Asi2 decreases proportionally from zero to −Afs/2 with a slope of −1. Then, as the level of analog input signal Ain increases from the threshold of second comparator 414 to the threshold of third comparator 416, the level of second selectively-inverted analog signal Asi2 increases proportionally from −Afs/2 to zero with a slope of +1.

At a level of analog input signal Ain equal to the threshold of third comparator 416, i.e., +Afs/2 on this example, third bit signal Bout3 output by third comparator 416 changes state, which causes combined bit signal BoutC to change state, as described above with reference to FIG. 17D. The change in state of combined bit signal BoutC changes second selective inverter 330 from its inverting mode to its non-inverting mode. Consequently, as the level of analog input signal Ain increases from the threshold of third comparator 415 to positive full-scale, the level of second selectively-inverted analog signal Asi2 changes in the same sense as first analog combined signal Ac1, and second selectively-inverted analog signal Asi2 therefore decreases proportionally from zero to −Afs/2 with a slope of −1. Note that, although the Ain/Asi2 transfer characteristic exhibits inflection points at levels of analog input signal Ain equal to the respective thresholds of first comparator 414, the transfer characteristic exhibits no discontinuities at these levels. Moreover, the level of second selectively-inverted analog signal Asi2 does not change at this level of the analog input signal. Finally, note that, at the levels of analog input signal Ain at which combined bit signal BoutC changes state and, hence, second selective inverter 330 changes from its non-inverting mode to its inverting mode and from its inverting mode to its non-inverting mode, the level of second selectively-inverted analog signal Asi2 at the output 336 of second selective inverter 330 is independent of the states of first bit signal Bout1 and third bit signal Bout3.

Figure 17F:
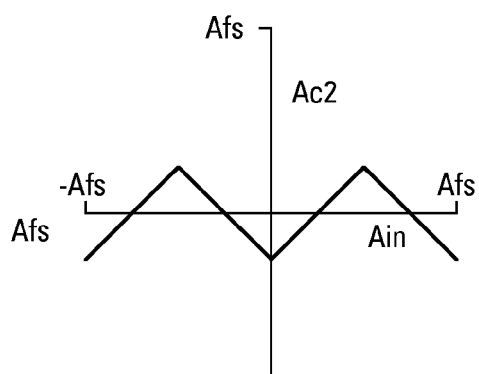

FIG. 17F is a graph showing the relationship between the level of second analog combined signal Ac2 at the output 346 of second summing element 340 and that of analog input signal Ain. Summing second selectively-inverted analog signal Asi2 with the second reference signal having a level of +Afs/4 generates second analog combined signal Ac2 shifted in level by +Afs/4 relative to second selectively-inverted analog signal Asi2. Thus, as the level of analog input signal Ain increases from negative full-scale to the threshold of first comparator 414, i.e., −Afs/2 in this example, the level of second analog combined signal Ac2 increases proportionally from −Afs/4 to +Afs/4 with a slope of +1. Then, as the level of the analog input signal increases from the threshold of first comparator 414 to the threshold of second comparator 415, i.e., zero in this example, the level of second analog combined signal Ac2 decreases proportionally from +Afs/4 to −Afs/4 with a slope of −1. Then, as the level of analog input signal Ain increases from the threshold of second comparator 415 to the threshold of third comparator 416, i.e., +Afs/2 in this example, the level of second analog combined signal Ac2 increases proportionally from −Afs/4 to +Afs/4 with a slope of +1. Finally, as the level of the analog input signal increases from the threshold of third comparator 416 to positive full-scale, the level of second analog combined signal Ac2 decreases proportionally from +Afs/4 to −Afs/4 with a slope of −1. Again, although the transfer characteristic exhibits inflection points at levels of analog input signal Ain equal to the respective thresholds of first comparator 414, second comparator 415 and third comparator 416, the transfer characteristic exhibits no discontinuity at these levels. Moreover, at levels of analog input signal Ain equal to the thresholds of first comparator 414 and third comparator 416, the levels of second combined analog signal Ac2 are independent of the respective states of bit signals Bout1 and Bout3.

Figure 17G:
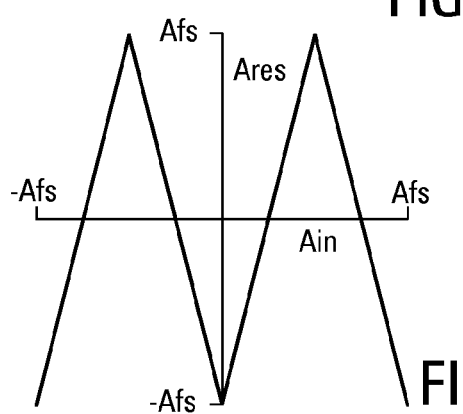

FIG. 17G is a graph showing the relationship between the level of analog residual signal Ares at the output 454 of amplifier 450 and that of analog input signal Ain. FIG. 17G represents the overall transfer function of conversion stage 500 with respect to analog residual signal Ares, and is identical to that shown in FIG. 14D for more complex two-bit conversion stage 400 described above with reference to FIG. 13. Amplifier 450 amplifies second analog combined signal Ac2 with a gain of four. As the level of analog input signal Ain increases from negative full-scale to the threshold of first comparator 414, i.e., −Afs/2 in this example, the level of analog residual signal Ares increases proportionally from −Afs to +Afs with a slope of +4. Then, as the level of the analog input signal increases from the threshold of first comparator 414 to the threshold of second comparator 415, i.e., zero in this example, the level of analog residual signal Ares decreases proportionally from +Afs to −Afs with a slope of −4. Then, as the level of analog input signal Ain increases from the threshold of second comparator 415 to the threshold of third comparator 416, i.e., +Afs/2 in this example, the level of analog residual signal Ares increases proportionally from −Afs to +Afs with a slope of +4. Finally, as the level of the analog input signal increases from the threshold of third comparator 416 to positive full-scale, the level of analog residual signal Ares decreases from +Afs to −Afs with a slope of −4. Again, although the transfer characteristic exhibits inflection points at levels of analog input signal Ain equal to the respective thresholds of first comparator 414, second comparator 415 and third comparator 416, the transfer characteristic exhibits no discontinuity at these levels. Moreover, at levels of analog input signal Ain equal to the thresholds of first comparator 414, second comparator 415 and third comparator 416, the levels of analog residual signal Ares are independent of the respective states of bit signals Bout1, Bout2 and Bout3.

The further simplified multiple-levels-per-stage conversion stage structure described above with reference to FIG. 16 can be extended to provide conversion stages that have any specified number of levels per stage and that generate a corresponding number of bits per stage. An example of an eight-levels-per-stage (three-bits-per-stage) conversion stage has seven comparators that collectively generate seven bit signals. The comparators have mutually-different thresholds offset from one another by twice full-scale divided by eight. The bit signals generated by the comparators are respectively numbered Bout1 through Bout7 in order of increasing thresholds of the comparators. The analog residual signal generator is composed of three selective inversion stages and an amplifier connected in series. Each of the selective inversion stages is composed of a selective inverter and a summing element in series in the stated order. The amplifier typically has a gain of eight, although other values may be used. In the first selective inversion stage, the selective multiplier operates in response to bit signal Bout4 and the summing element receives a reference signal having a level equal to positive one-half of full-scale, i.e., +Afs/2. In the second selective inversion stage, the selective multiplier operates in response to a first combined bit signal BoutC1 and the summing element receives a reference signal equal to positive one-quarter of full-scale, i.e., +Afs/4. First combined bit signal BoutC1 is obtained by XOR-ing bit signals Bout2 and Bout6. In the third selective inversion stage, the selective multiplier operates in response to a second combined bit signal BoutC2 and the summing element receives a reference signal equal to positive one-eighth of full-scale, i.e., +Afs/8. Second combined bit signal BoutC2 is obtained by XOR-ing bit signals Bout1, Bout3, Bout5 and Bout7.

To generalize, a conversion stage that has R levels per stage, where R is an integer power of two, is composed of R−1 comparators that collectively generate R−1 bit signals. The comparators have mutually-different thresholds and offset from one another by twice full-scale divided by R, and the bit signals respectively generated by the comparators are assigned respective identification numbers 1 through R−1 in order of increasing thresholds of the comparators, as described above. The analog residual signal generator is composed of P selective inversion stages and an amplifier in series, where P=$\log_2 R$. Each selective inversion stage is composed of a selective inverter preceding a summing element. The amplifier typically has a gain of R, although other values may be used.

In a first selective inversion stage, where the order of the selective inversion stages is counted from the input of analog residual signal generator 520, the selective multiplier operates in response to the bit signal whose identification number is divisible by R/2, and the summing element receives a reference signal having a level equal to positive full-scale divided by two, i.e., +Afs/2. In a selective inversion stage numbered q, where q is an integer and $2 \leq q \leq P$, the selective inverter operates in response to a combined bit signal BoutCq and the summing element receives a reference signal equal to positive full-scale divided by $2^q$, i.e., +Afs/2. Combined bit signal BoutCq is generated by XOR-ing those of the bit signals whose identification numbers are divisible by R/2 but are not divisible by $R/2^{q-1}$.

An embodiment of conversion stage 500 in which the number of levels R is not an integer power of two is composed of R−1 comparators that have mutually-different thresholds offset from one another by twice full-scale divided by R, as described above. The bit signals respectively generated by the comparators are assigned respective identification numbers 1 through R−1 in order of increasing thresholds of the comparators, also as described above. Q is defined as $\log_2 R$ rounded up to the next integer, and S is defined as $S=2^Q$. MSB offset X is any integer from 0 to S−R and is typically (S−R)/2 rounded to an integer. This choice of the MSB offset causes the bit signal that controls first selective inversion stage 522 to change state at a level near the mid-point of the range of analog input signal Ain, i.e., near a level of zero in this example. Analog residual signal generator 520 is composed of Q selective inversion stages and amplifier 450. Each selective inversion stage is composed of a summing element preceded by a selective inverter. The amplifier typically has a gain of R, although other values may be used.

In a first selective inversion stage, the selective inverter operates in response to the bit signal whose identification number is divisible by R/2, and the summing element receives a reference signal having a level equal to positive full-scale divided by two, i.e., +Afs/2. In a selective inversion stage numbered q, where q is an integer and $2 \leq q \leq Q$, the selective inverter operates in response to a combined bit signal BoutCq generated by XOR-ing those of the bit signals whose identification numbers plus X are each divisible by $2^Q/2^q$ but not by $2^Q/2^{q-1}$. In each selective inversion stage but the last (q<Q), $2^{q-1}$ bit signals are XOR-ed to generate the respective combined bit signal BoutCq. However, bBecause R is less than $2^Q$, fewer than $2^{q-1}$ bit signals are XOR-ed to generate combined bit signal BoutCq in the last selective inversion stage (q=Q). The summing element is connected to receive a reference signal equal to twice positive full-scale divided by $2^q$, i.e., +Afs/$2^q$.

In a conversion stage having an odd number of levels, an initial summing element similar to initial summing element 240 described above with reference to FIG. 13 precedes the first selective in analog residual signal generator 520 and receives a reference signal equal to positive or negative full-scale divided by S, i.e., ±Afs/S, although other values may be used. The value can be different depending on whether redundancy is desired.

In another example of a P-bit conversion stage having R levels per stage, the analog residual signal generator is composed of P selective inversion stages connected in series. Each selective inversion stages is composed of a selective inverter, a summing element and an amplifier connected in series. The overall gain of the amplifier in the example just described is distributed among the amplifiers constituting the selective inversion stages. If each of the amplifiers has a gain of two, each summing element receives a reference signal equal to positive one-half of full-scale, i.e., +Afs/2. In each selective inversion stage, the selective inverter precedes the summing element and the amplifier may be located in any of the positions described above with reference to FIGS. 3, 5 and 7 relative to the selective inverter and the summing element. Some amplifier placements will require adjustments to the reference signals, as described above. In each selective inversion stage, the selective inverter is operable in response to one or more bit signals as described above.

Any one of the above-described analog-to-digital conversion stages may constitute one conversion stage of a multi-stage ADC. Additionally, any one of the above-described conversion stages may constitute the conversion stage of a cyclic ADC in which the analog residual signal generated by the conversion stage is held and is fed back to the input of the conversion stage. The conversion stage performs a series of conversion operations each using the analog residual signal generated by the previous conversion operation as the analog input signal.

This disclosure describes the invention in detail using illustrative embodiments. However, the invention defined by the appended claims is not limited to the precise embodiments described.

I claim:

1. In an analog-to-digital converter, an analog-to-digital conversion stage, comprising:
   a comparator operable to compare one of (a) an analog input signal and (b) a sample of the analog input signal with a threshold to generate a bit signal; and
   an analog residual signal generator operable to generate an analog residual signal from signals comprising the sample of the analog input signal and the bit signal, the analog residual signal generator comprising, in series:
      a summing element operable to sum a signal input thereto with a reference signal,
      a selective inverter preceding the summing element, the selective inverter operable in response to a first state of the bit signal to pass a signal input thereto and operable in response to a second state of the bit signal to invert the signal input thereto, and
      an amplifier, in which:
   the analog residual signal generator is operable to generate the analog residual signal such that, at a level of the analog input signal equal to the threshold of the comparator, the analog residual signal has a level independent of the state of the bit signal.

2. The analog-to-digital conversion stage of claim 1, in which the amplifier follows the summing element.

3. The analog-to-digital conversion stage of claim 2, in which:
   the analog input signal has a level within a range extending to a full-scale level; and
   the reference signal has a level equal to one-half of the full-scale level.

4. The analog-to-digital conversion stage of claim 1, in which the amplifier is located between the selective inverter and the summing element.

5. The analog-to-digital conversion stage of claim 4, in which:
   the analog input signal has a level within a range extending from a negative full-scale level to a positive full-scale level; and
   the reference signal has a level equal to the full-scale level.

6. The analog-to-digital conversion stage of claim 1, in which the amplifier precedes the selective inverter.

7. The analog-to-digital conversion stage of claim 6, in which:
   the analog input signal has a level within a range extending from a negative full-scale level to a positive full-scale level; and
   the reference signal has a level equal to the full-scale level.

8. The analog-to-digital conversion stage of claim 1, in which the selective inverter has a unilateral transfer characteristic from input to output.

9. The analog-to-digital conversion stage of claim 1, in which the selective inverter comprises a Gilbert cell.

10. The analog-to-digital conversion stage of claim 1, in which the selective inverter has a bilateral transfer characteristic between input and output and the residual signal generator additionally comprises an isolator between the selective inverter and the summing element.

11. The analog-to-digital conversion stage of claim 1, in which:
   the comparator is a first comparator, the threshold is a first threshold, the bit signal is a first bit signal, the reference signal is a first reference signal, the selective inverter is a first selective inverter and is operable in response to the first bit signal, and the summing element is a first summing element;
   the analog-to-digital conversion stage additionally comprises a second comparator operable to compare the one of (a) the analog input signal and (b) the sample of the analog input signal with a second threshold and to generate a second bit signal in response;
   the analog residual signal generator additionally comprises a second summing element and a second selective inverter in series with the first summing element, the first selective inverter and the amplifier;
   the second selective inverter precedes the second summing element and is operable in response to the second bit signal; and
   the second summing element is operable to sum a signal input thereto with a second reference signal.

12. The analog-to-digital conversion stage of claim 1, in which:
   the analog-to-digital conversion stage is an R-levels-per-stage conversion stage, where R is an integer, and the comparator is one of (R−1) comparators each operable to compare the one of (a) the analog input signal and (b) the sample of the analog input signal with a respective threshold to generate a respective bit signal, the comparators having mutually-different thresholds; and
   the analog residual signal generator additionally comprises an additional selective inverter and an additional summing element, in order, in series with the selective inverter, the summing element and the amplifier, the additional selective inverter operable in response to one of (a) one of the bit signals and (b) a combined bit signal obtained by exclusively-OR-ing at least two of the bit signals.

13. The analog-to-digital conversion stage of claim 1, in which:
   the analog-to-digital conversion stage is an R-levels-per-stage conversion stage, where R is an integer, and the comparator is one of (R−1) comparators each operable to compare the one of (a) the analog input signal and (b) the sample of the analog input signal with a respective threshold to generate a respective bit signal, the comparators having mutually-different thresholds; and
   the selective inverter is one of (R−1) selective inverters and the summing element is one of R summing elements interleaved with the selective inverters, each of the selective inverters operable in response to a respective one of the bit signals, each of the summing elements connected to receive a respective reference signal having a level such that, at a level of the analog signal equal to the threshold of each of the comparators, the level of the analog residual signal is independent of the state of the respective bit signal.

14. The analog-to-digital conversion stage of claim 1, in which:
the analog-to-digital conversion stage is an R-levels-per-stage conversion stage, where R is an integer, and the comparator is one of (R−1) comparators each operable to compare the one of (a) the analog input signal and (b) the sample of the analog input signal with a respective threshold to generate a respective bit signal, the comparators having mutually-different thresholds;
the bit signals respectively generated by the comparators are assigned identifications numbers in order of increasing thresholds of the comparators ; and
the selective inverter and the summing element collectively constitute a first selective inversion stage and the analog residual signal generator additionally comprises P−1 additional selective inversion stages connected in series between the first selective inversion stage and the amplifier, where P=log$_2$R, and a selective inversion stage numbered t comprises $2^{t-4}$ selective inverters and a summing element, each of the selective inverters operating in response to a respective one of those of the bit signals whose identification numbers are each divisible by R/$2^t$ but not by R/$2^{-1}$, the summing element is connected to receive a reference signal equal to positive full-scale divided by $2^t$.

15. The analog-to-digital conversion stage of claim 14, in which:
the number of levels R is not an integral power of two,
a quantity Q is defined as the logarithm to the base two of R rounded up to the next integer and a quantity S is defined as S=$2^Q$,
the analog-to-digital conversion stage has a most-significant bit offset X, where X is any integer between zero and (S−R);
the number of selective inversion stages is equal to Q, and
in the selective inversion stage numbered t, where 1≦t≦Q:
the selective inverters are equal in number to those of the bit signals whose identification numbers are each divisible by $2^Q/2^t$ but not by $2^Q/2^{t-1}$,
each of the selective inverters is operable in response to a respective one of those of the bit signals whose identification numbers are divisible by $2^Q/2^t$ but not by $2^Q/2^{t-1}$, and
the summing element is connected to receive a reference signal equal to twice positive full-scale divided by $2^t$.

16. The analog-to-digital conversion stage of claim 15, in which:
the number of levels R is odd; and
the analog residual signal generator additionally comprises an initial summing element preceding the selective inversion stages, the initial summing element connected to receive a reference signal equal to positive or negative full-scale divided by S.

17. The analog-to-digital conversion stage of claim 1, in which the analog-to-digital conversion stage is an R-levels-per-stage conversion stage, where R is an integer, and the comparator is one of (R−1) comparators each operable to compare the one of (a) the analog input signal and (b) the sample of the analog input signal with a respective threshold to generate a respective bit signal, the comparators having mutually-different thresholds;
the bit signals respectively generated by the comparators are assigned identification numbers in order of increasing thresholds of the comparators;
the selective inverter and the summing element collectively constitute one of P selective inversion stages, the summing element following the selective inverter in each of the selective inversion stages;
in a first one of the selective inversion stages, the selective inverter is operable in response to a one of the bit signals whose identification number is R/2, and the summing element is connected to receive a reference signal having a level equal to full-scale divided by two; and
in one of the selective inversion stages numbered q, where q is an integer and 2≦q≦log$_2$R:
the selective inverter is operable in response to a respective combined bit signal obtaining by exclusively-OR-ing those of the bit signals whose identification numbers are divisible by R/$2^q$ but are not divisible by R/$2^{q-1}$, and
the summing element is connected to receive a respective reference signal equal to positive full-scale divided by $2^q$.

18. The analog-to-digital conversion stage of claim 17, in which:
the number of levels R is not an integral power of two,
a quantity Q is defined as log$_2$R rounded up to the next integer and a quantity S is defined as S=$2^Q$,
the analog-to-digital conversion stage has a most-significant bit offset X, where X is any integer between zero and (S−R);
the number of selective inversion stages is equal to Q, and
in the one of the selective inversion stages numbered q, the selective inverter in response to a combined bit signal generated by exclusively-OR-ing those of the bit signals whose identification numbers are divisible by $2^Q/2^q$ but not by $2^Q/2^{q-1}$.

19. The analog-to-digital conversion stage of claim 18, in which:
the number of levels R is odd; and
the analog residual signal generator additionally comprises an initial summing element preceding the selective inversion stages, the initial summing element connected to receive a reference signal equal to positive or negative full-scale divided by S.

20. The analog-to-digital conversion stage of claim 14, in which:
the amplification is distributed equally among the P selective inverter-summing element pairs; and
in each of the selective inverter-summing element pairs, the summing element is connected to receive a reference signal equal to positive full-scale divided by two.

21. An analog-to-digital conversion method, comprising:
sampling an analog input signal to generate an analog signal sample;
comparing one of (a) the analog input signal and (b) the analog signal sample with a threshold to generate a bit signal; and
subjecting the analog signal sample to sequential processing to generate an analog residual signal such that, at a level of the analog input signal equal to the threshold of the comparing, the analog residual signal has a level independent of the state of the bit signal, the sequential processing comprising:
amplifying,
selective inverting in response to the bit signal, and
after the selective inverting, summing with a reference signal.

22. An analog-to-digital conversion method, comprising:
sampling an analog input signal to generate an analog signal sample;

comparing one of (a) the analog input signal and (b) the analog signal sample with a threshold to generate a bit signal; and subjecting the analog signal sample to sequential processing to generate an analog residual signal, the sequential processing comprising:
 amplifying,
 selective inverting in response to the bit signal,
 after the selective inverting, summing with a reference signal, and
 isolating the selective inverting from the summing.

23. An analog-to-digital conversion method, comprising:
sampling an analog input signal to generate an analog signal sample;
comparing one of (a) the analog input signal and (b) the analog signal sample with a first threshold to generate a first bit signal; and
comparing the one of (a) the analog input signal and (b) the analog signal sample with a second threshold to generate a second bit signal; and
subjecting the analog signal sample to sequential processing to generate an analog residual signal, the sequential processing comprising:
 amplifying,
 selective inverting in response to the first bit signal,
 after the selective inverting, summing with a first reference signal;
 additional selective inverting in response to the second bit signal, and
 after the additional selective inverting, additional summing with a second reference signal.

24. The analog-to-digital conversion method of claim 23, in which the sequential processing additionally comprises initial summing with an initial reference signal before the summing with the first reference signal.

25. The analog-to-digital conversion method of claim 24, in which:
the method additionally comprises comparing the one of (a) the analog input signal and (b) the analog signal sample with a third threshold, different from the first threshold and the second threshold, to generate a third bit signal;
the sequential processing additionally comprises:
 additional selective inverting in response to the third bit signal, and
 after the additional selective inverting in response to the third bit signal, summing with a third reference signal.

26. The analog-to-digital conversion method of claim 23, in which:
the method additionally comprises:
 comparing the one of (a) the analog input signal and (b) the analog signal sample with a third threshold, different from the first threshold and the second threshold, to generate a third bit signal, and
 exclusively-OR-ing the first bit signal and the third bit signal to generate a combined bit signal; and
the selective inverting in response to the first bit signal is performed in response to the combined bit signal.

* * * * *

UNITED STATES PATENT AND TRADEMARK OFFICE
CERTIFICATE OF CORRECTION

PATENT NO.         : 7,492,302 B2
APPLICATION NO.    : 11/742489
DATED              : February 17, 2009
INVENTOR(S)        : Poulton It is certified that error appears in the above-identified patent and that said Letters Patent is hereby corrected as shown below:

In column 36, line 61, in Claim 13, delete "of(R-1)" and insert -- of (R-1) --, therefor.

In column 37, line 22, in Claim 14, delete "$2^{t-4}$" and insert -- $2^{t-1}$ --, therefor.

In column 37, line 26, in Claim 14, delete "$R/2^{-1}$," and insert -- $R/2^{t-1}$, --, therefor.

Signed and Sealed this

Seventh Day of July, 2009

JOHN DOLL
*Acting Director of the United States Patent and Trademark Office*